(12) United States Patent
Kim et al.

(10) Patent No.: US 8,233,120 B2
(45) Date of Patent: Jul. 31, 2012

(54) LIQUID CRYSTAL DISPLAY DEVICE WITH LIGHT-SHIELDING COLOR FILTER PATTERN AND METHOD FOR FABRICATING THE SAME

(75) Inventors: Woong-Kwon Kim, Gunpo-si (KR); Seung-Ryull Park, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/343,351

(22) Filed: Jan. 4, 2012

(65) Prior Publication Data

US 2012/0099059 A1 Apr. 26, 2012

Related U.S. Application Data

(62) Division of application No. 10/731,950, filed on Dec. 10, 2003, now Pat. No. 8,107,038.

(30) Foreign Application Priority Data

Dec. 26, 2002 (KR) .............................. 10-2002-84611

(51) Int. Cl.
*G02F 1/1335* (2006.01)
*G09G 3/36* (2006.01)

(52) U.S. Cl. .......................................... 349/106; 345/88
(58) Field of Classification Search .................. 349/106; 345/88
See application file for complete search history.

(56) References Cited

U.S. PATENT DOCUMENTS

| | | | |
|---|---|---|---|
| 4,470,667 A | 9/1984 | Okubo et al. | |
| 5,757,451 A | 5/1998 | Miyazaki et al. | |
| 5,825,449 A | 10/1998 | Shin | |
| 5,933,208 A | 8/1999 | Kim | |
| 6,031,512 A | 2/2000 | Kadota et al. | |
| 6,111,623 A | 8/2000 | Sato | |
| 6,118,505 A | 9/2000 | Nagata et al. | |
| 6,137,552 A | 10/2000 | Yanai | |
| 6,191,835 B1 * | 2/2001 | Choi | 349/106 |
| 6,281,955 B1 | 8/2001 | Midorikawa et al. | |

(Continued)

FOREIGN PATENT DOCUMENTS

JP 62-250416 10/1987

(Continued)

OTHER PUBLICATIONS

Search Report from corresponding application No. GB 0327846.2.
Office Action issued in corresponding Korean Patent Application No. 10-2002-0084611, issued Sep. 19, 2008.

*Primary Examiner* — Hoan C Nguyen
(74) *Attorney, Agent, or Firm* — Brinks Hofer Gilson & Lione

(57) ABSTRACT

A liquid crystal display device includes gate and data lines defining a pixel region on a first substrate. A first insulating layer covers the gate line and a gate electrode. A thin film transistor, formed at a crossing region of the gate and data lines, has the gate electrode, a semiconductor layer, a source electrode, and a drain electrode. A red, green or blue color filter is formed over the first insulating layer in the pixel region. A drain contact hole exposes the drain electrode. A light-shielding color filter pattern including at least two of red, green and blue resins is formed over the semiconductor layer. A pixel electrode is formed over the color filter in the pixel region and contacts the drain electrode. A common electrode is formed on a second substrate facing the first substrate with a liquid crystal layer interposed between the common and pixel electrodes.

16 Claims, 27 Drawing Sheets

U.S. PATENT DOCUMENTS

| | | |
|---|---|---|
| 6,445,432 B2 | 9/2002 | Yamamoto et al. |
| 6,861,185 B2 * | 3/2005 | Tanaka et al. .................... 430/7 |
| 7,193,668 B2 * | 3/2007 | Kim .............................. 349/106 |
| 2001/0005245 A1 | 6/2001 | Sakamoto et al. |
| 2003/0043326 A1 | 3/2003 | Sawasaki et al. |

FOREIGN PATENT DOCUMENTS

| | | |
|---|---|---|
| JP | 08-146402 | 6/1996 |
| JP | 2001-183648 | 7/2001 |
| JP | 2003-149431 | 5/2003 |

* cited by examiner

LIQUID CRYSTAL DISPLAY DEVICE WITH LIGHT-SHIELDING COLOR FILTER PATTERN AND METHOD FOR FABRICATING THE SAME

The present patent document is a divisional of U.S. patent application Ser. No. 10/731,950, filed Dec. 10, 2003, which claims priority to Korean Patent Application No. 2002-84611 filed in Korea on Dec. 26, 2002, which is hereby incorporated by reference.

BACKGROUND

1. Field of the Invention

The present invention relates to a liquid crystal display device, and more particularly, to a method for fabricating an array substrate having color filter patterns on a thin film transistor structure without a black matrix. Although the present invention is suitable for a wide scope of applications, it is particularly suitable for increasing an aperture ratio and simplifying the fabrication process.

2. Discussion of the Related Art

In general, since flat panel display devices are thin, light weight, and have a low power consumption, they have been used for portable display devices. Among the various types of flat panel display devices, liquid crystal display (LCD) devices are widely used for laptop computers and desktop computer monitors because of their superiority in resolution, color image display, and display quality.

Optical anisotropy and polarization characteristics of liquid crystal molecules are utilized to generate desirable images. Liquid crystal molecules have specific alignment directions that result from their own peculiar characteristics. The specific alignment directions can be modified by electric fields that are applied upon the liquid crystal molecules. In other words, the electric fields applied upon the liquid crystal molecules can change the alignment of the liquid crystal molecules. Due to the optical anisotropy, the incident light is refracted according to the alignment of the liquid crystal molecules.

Specifically, the LCD devices include upper and lower substrates having electrodes that are spaced apart and face into each other, and a liquid crystal material is interposed therebetween. Accordingly, when a voltage is applied to the liquid crystal material through the electrodes of each substrate, an alignment direction of the liquid crystal molecules is changed in accordance with the applied voltage, thereby displaying images. By controlling the applied voltage, the LCD device provides various light transmittances to display image data.

The liquid crystal display (LCD) devices are widely applied in office automation (OA) and video equipment due to their characteristics such as light weight, slim design, and low power consumption. Among different types of LCD devices, active matrix LCDs (AM-LCDs) having thin film transistors and pixel electrodes arranged in a matrix form provide high resolution and superiority in displaying moving images. A typical LCD panel has an upper substrate, a lower substrate, and a liquid crystal layer interposed therebetween. The upper substrate (referred to as a color filter substrate) includes a common electrode and color filters. The lower substrate (referred to as an array substrate) includes thin film transistors (TFT's), such as switching elements, and pixel electrodes.

As previously described, the operation of an LCD device is based on the principle that the alignment direction of liquid crystal molecules varies with applied electric fields between the common electrode and the pixel electrode. Accordingly, the liquid crystal molecules function as an optical modulation element having variable optical characteristics that depend upon the polarity of the applied voltage.

FIG. 1 is an expanded perspective view illustrating a related art active matrix liquid crystal display device. As shown in FIG. 1, the LCD device 11 includes an upper substrate 5 (referred to as a color filter substrate) and a lower substrate 22 (referred to as an array substrate) having a liquid crystal layer 14 interposed therebetween. On the upper substrate 5, a black matrix 6 and a color filter layer 8 are formed in an array matrix including a plurality of red (R), green (G), and blue (B) color filters surrounded by the black matrix 6. Additionally, a common electrode 18 is formed on the upper substrate 5 and covers the color filter layer 8 and the black matrix 6.

On the lower substrate 22, a plurality of thin film transistors T are formed in an array matrix corresponding to the color filter layer 8. A plurality of gate lines 13 and data lines 15 perpendicularly cross one another such that each TFT T is located adjacent to each intersection of the gate lines 13 and the data lines 15. Furthermore, a plurality of pixel electrodes 17 are formed on a pixel region P defined by the gate lines 13 and the data lines 15 of the lower substrate 22. The pixel electrode 17 is formed of a transparent conductive material having high transmissivity, such as indium tin oxide (ITO) or indium zinc oxide (IZO).

Still in FIG. 1, a storage capacitor C is disposed to correspond to each pixel P and connected in parallel to each pixel electrode 17. The storage capacitor C is comprised of a portion of the gate line 13 as a first capacitor electrode, a storage metal layer 30 as a second capacitor electrode, and an interposed insulator (shown as reference numeral 16 of FIG. 2). Since the storage metal layer 30 is connected to the pixel electrode 17 through a contact hole, the storage capacitor C electrically contacts the pixel electrode 17.

In the related art LCD device shown in FIG. 1, a scanning signal is applied to the gate electrode of the thin film transistor T through the gate line 13, and a data signal is applied to the source electrode of the thin film transistor T through the data line 15. As a result, the liquid crystal molecules of the liquid crystal material layer 14 are aligned and arranged by the operation of the thin film transistor T, and the incident light passing through the liquid crystal layer 14 is controlled to display an image. Namely, the electric fields induced between the pixel and common electrodes 17 and 18 re-arrange the liquid crystal molecules of the liquid crystal material layer 14 so that the incident light can be converted into the desired images in accordance with the induced electric fields.

When fabricating the LCD device 11 of FIG. 1, the upper substrate 5 is aligned with and attached to the lower substrate 22. In this process, the upper substrate 5 may be misaligned with respect to the lower substrate 22, and a light leakage may occur in the completed LCD device 11 due to a marginal error in attaching the upper and lower substrates 5 and 22.

FIG. 2 is a schematic cross-sectional view taken along line of FIG. 1, illustrating a pixel of the related art liquid crystal display device.

As shown in FIG. 2, the related art LCD device includes the upper substrate 5, the lower substrate 22, and the liquid crystal layer 14. The upper and lower substrates 5 and 22 are spaced apart from each other, and the liquid crystal layer 14 is interposed therebetween. The upper and lower substrates 5 and 22 are often referred to as a color filter substrate and an array substrate, respectively, because the color filter layer 8 is formed upon the upper substrate and a plurality of array elements are formed on the lower substrate 22.

In FIG. 2, the thin film transistor T is formed on the front surface of the lower substrate 22. The thin film transistor T includes a gate electrode 32, an active layer 34, a source electrode 36, and a drain electrode 38. Between the gate electrode 32 and the active layer 34, a gate insulation layer 16 is interposed to protect the gate electrode 32 and the gate line 13. As shown in FIG. 1, the gate electrode 32 extends from the gate line 13 and the source electrode 36 extends from the data line 15. All of the gate, source, and drain electrodes 32, 36, and 38 are formed of a metallic material while the active layer 34 is formed of silicon. A passivation layer 40 is formed on the thin film transistor T for protection. In the pixel region P, the pixel electrode 17 formed of a transparent conductive material is disposed on the passivation layer 40 and contacts the drain electrode 38 and the storage metal layer 30.

Meanwhile, as mentioned above, the gate electrode 13 acts as a first electrode of the storage capacitor C and the storage metal layer 30 acts as a second electrode of the storage capacitor C. Thus, the gate electrode 13 and the storage metal layer 30 constitute the storage capacitor C with the interposed gate insulation layer 16.

Still referring to FIG. 2, the upper substrate 5 is spaced apart from the lower substrate 22 over the thin film transistor T. On the rear surface of the upper substrate 5, a black matrix 6 is disposed in a position corresponding to the thin film transistor T, the gate line 13 and the data line 15. The black matrix 6 is formed on the entire surface of the upper substrate 5 and has openings corresponding to the pixel electrode 17 of the lower substrate 22, as shown in FIG. 1. The black matrix 6 prevents a light leakage in the LCD panel except for the portion for the pixel electrode 17. The black matrix 6 protects the thin film transistor T from the light such that the black matrix 6 prevents generation of a photo-current in the thin film transistor T. The color filter layer 8 is formed on the rear surface of the upper substrate 5 to cover the black matrix 6. Each of the color filters 8 has one of the red 8a, green 8b, and blue 8b colors and corresponds to one pixel region P where the pixel electrode 17 is located. A common electrode 18 formed of a transparent conductive material is disposed on the color filter layer 8 over the upper substrate 5.

In the related art LCD panel mentioned above, the pixel electrode 17 has a one-to-one correspondence with one of the color filters. Furthermore, in order to prevent a cross-talk between the pixel electrode 17 and the gate and data lines 13 and 15, the pixel electrode 17 is spaced apart from the data line 15 by the distance A and from the gate line 13 by the distance B, as shown in FIG. 2. The open spaces A and B between the pixel electrode 17 and the data and gate line 15 and 13 cause a malfunction such as a light leakage in the LCD device. Namely, the light leakage mainly occurs in the open spaces A and B so that the black matrix 6 formed on the upper substrate 5 should cover the open spaces A and B. However, when the upper substrate 5 is arranged with the lower substrate 22 or vice versa, a misalignment may occur between the upper substrate 5 and the lower substrate 22. Therefore, the black matrix 6 is extended to completely cover the open spaces A and B. That is, the black matrix 6 is designed to provide an aligning margin to prevent light leakage. However, in the case of extending the black matrix, an aperture ratio of a liquid crystal panel is reduced as much as the aligning margin of the black matrix 6. Moreover, if there are errors in the aligning margin of the black matrix 6, a light leakage still occurs in the open spaces A and B, and deteriorates the image quality of an LCD device.

Moreover, in the related art of FIGS. 1 and 2, the black matrix 6 formed on the upper substrate 5 corresponds in position to the thin film transistor T and then protects the thin film transistor from external light incident to the thin film transistor T. Therefore, the black matrix 6 prevents the occurrence of photo current that may be caused by the incident light in the active layer 34 of the thin film transistor T. However, when the misalignment occurs between the upper substrate 5 and the lower substrate 22, the black matrix 5 may not protect the thin film transistor T and the photo current may occur in the active layer of the thin film transistor T, thereby degrading the image quality of the liquid crystal display device.

BRIEF SUMMARY

Accordingly, a method for fabricating an array substrate having a color filter-on-thin film transistor (COT) structure for a liquid crystal display device is presented (as well as the array substrate itself) that substantially obviates one or more of problems due to limitations and disadvantages of the related art.

Thus, embodiments of the present invention provide an array substrate and a method of forming the same, which provide a high aperture ratio.

One embodiment of the present invention provides a method for fabricating an array substrate having a COT structure for a liquid crystal display device, which simplifies the manufacturing process and increases the manufacturing yield.

Another embodiment of the present invention provides an array substrate and a method of forming the same, which protects a thin film transistor using color filter patterns and prevents a photo current using the color filter patterns.

Additional features and advantages of the invention will be set forth in the description which follows and in part will be apparent from the description, or may be learned by practice of the invention. Other advantages of the invention will be realized and attained by the structure particularly pointed out in the written description and claims hereof as well as the appended drawings.

To achieve these and other advantages of the present invention, as embodied and broadly described, a liquid crystal display device includes a plurality of gate lines formed on a first substrate along a transverse direction, each gate line including a gate electrode; a first insulating layer formed on the first substrate to cover the gate lines and the gate electrodes; a plurality of data lines formed on the first insulating layer along a longitudinal direction, the data lines defining a plurality of pixel regions with the gate lines and each including a source electrode; a thin film transistor formed at a crossing region of each of the gate and data lines, each thin film transistor including one of the gate electrodes, a semiconductor layer, one of the source electrodes, and a drain electrode; a color filter over the first insulating layer in each pixel region, each color filter having one of red, green and blue colors, the color filters having a plurality of drain contact holes exposing the drain electrodes; a light-shielding color filer pattern over each thin film transistor, each light-shielding color filter pattern including at least two of red, green and blue color resins; a pixel electrode over the color filter in each pixel region, each pixel electrode contacting one of the drain electrodes; a common electrode on a second substrate, the common electrode facing the first substrate; and a liquid crystal layer interposed between the common electrode and the pixel electrodes.

In another aspect of the present invention, a method of fabricating a liquid crystal display device includes forming a plurality of gate lines on a first substrate along a transverse direction, each gate line including a gate electrode; forming a first insulating layer on the first substrate to cover the gate lines and the gate electrodes; forming a plurality of data lines on the first insulating layer along a longitudinal direction, the data lines defining a plurality of pixel regions with the gate lines and each including a source electrode; forming a thin film transistor formed at a crossing region of each of the gate and data lines, each thin film transistor including one of the gate electrodes, a semiconductor layer, one of the source electrodes, and a drain electrode; forming a color filter over the first insulating layer in each pixel region, each color filter having one of red, green and blue colors and a drain contact hole exposing the drain electrode; forming a light-shielding color filter pattern over each semiconductor layer, each light-shielding color filter pattern including at least two of red, green and blue color resins; forming a pixel electrode over the color filter in each pixel region, each pixel electrode contacting one of the drain electrodes; forming a common electrode on a second substrate, the common electrode facing the first substrate; and forming a liquid crystal layer between the common electrode and the pixel electrodes.

In another aspect, a method of fabricating an array substrate for use in a liquid crystal display device includes forming a plurality of gate lines and a plurality of gate electrodes on a substrate, the gate lines disposed along a transverse direction and the gate electrodes extending from the gate lines; forming a first insulating layer on the substrate to cover the gate lines and the gate electrodes; forming active layers of amorphous silicon and ohmic contact layers of doped amorphous silicon on the first insulating layer, each active layer and ohmic contact layer disposed above one of the gate electrodes; forming a plurality of data lines, a plurality of source electrodes and a plurality of drain electrodes, the data lines defining pixel regions with the gate lines, wherein the source and drain electrodes contact the ohmic contact layers and are spaced apart from each other, and wherein the source electrodes extend from the data lines, thereby completing a thin film transistor at a crossing of each of the gate and data lines; forming a red color filter in a red pixel region and a red color filter pattern over each thin film transistor; forming a green color filter in a green pixel region and a green color filter pattern over each thin film transistor; forming a blue color filter in a blue pixel region and a blue color filter pattern over each thin film transistor; and forming a pixel electrode in each of the pixel regions over each of the red, green and blue color filters; wherein forming the red, green and blue color filters forms a light-shielding color filter pattern consisting of at least two of the red, green and blue color filter patterns.

In another aspect, a liquid crystal display device, comprises: a plurality of gate lines formed on a first substrate along a transverse direction, each gate line including a gate electrode; a first insulating layer formed on the first substrate to cover the gate lines and the gate electrodes; a plurality of data lines formed on the first insulating layer along a longitudinal direction, the data lines defining a plurality of pixel regions with the gate lines, each data line including a source electrode; a plurality of thin film transistors formed at a crossing region of the gate and data lines, the thin film transistors each including the gate electrode, a semiconductor layer, the source electrode, and a drain electrode; a plurality of pixel electrodes formed on the first substrate in the pixel regions and contacting the drain electrodes; a common electrode on a second substrate, the common electrode facing the first substrate; a liquid crystal layer interposed between the common electrode and the pixel electrodes; a plurality of color filters disposed on one of the first and second substrates in the pixel regions, each color filter containing one of red, green and blue color resins; and a plurality of light-shielding color filter patterns disposed on the one of the first and second substrates such that the light-shielding color filter patterns cover the semiconductor layers to shield the semiconductor layers from incident light, each light-shielding color filter pattern including at least two of the red, green and blue color resins disposed sequentially between the semiconductor layer and the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE DRAWINGS AND THE PRESENTLY PREFERRED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
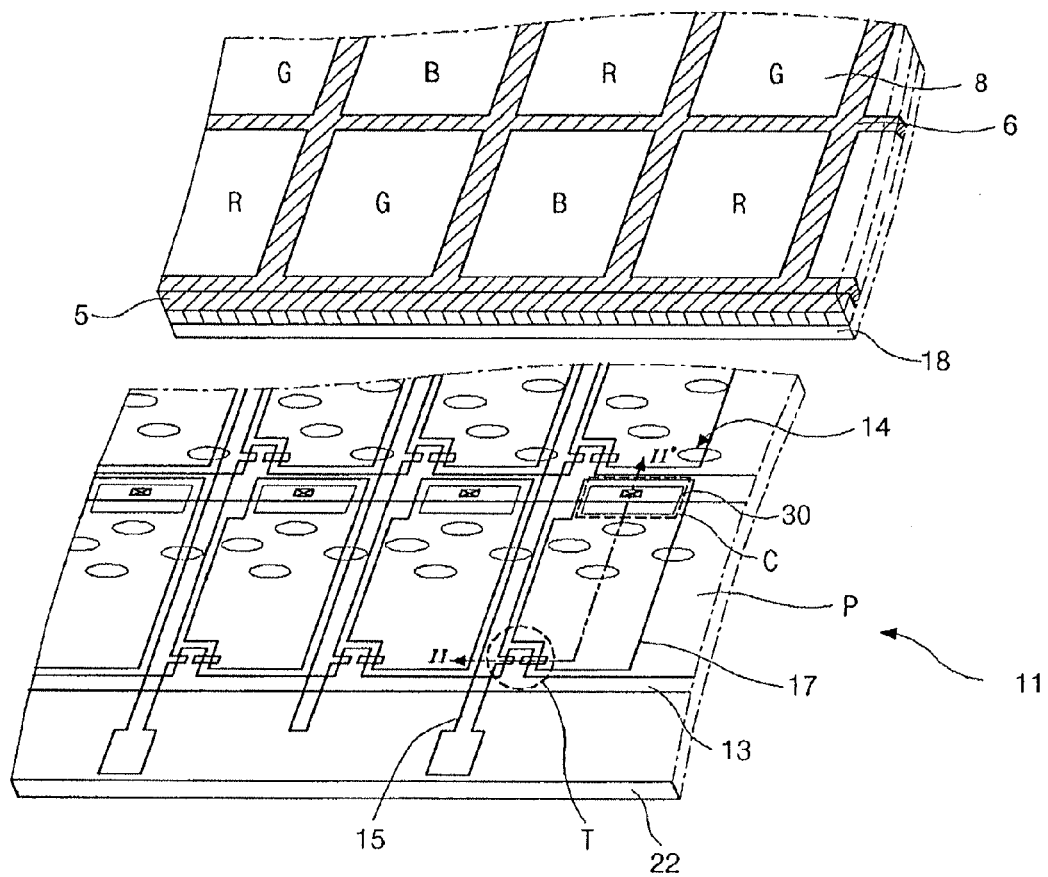
FIG. 1 is an expanded perspective view illustrating a related art liquid crystal display device.
Figure 2:
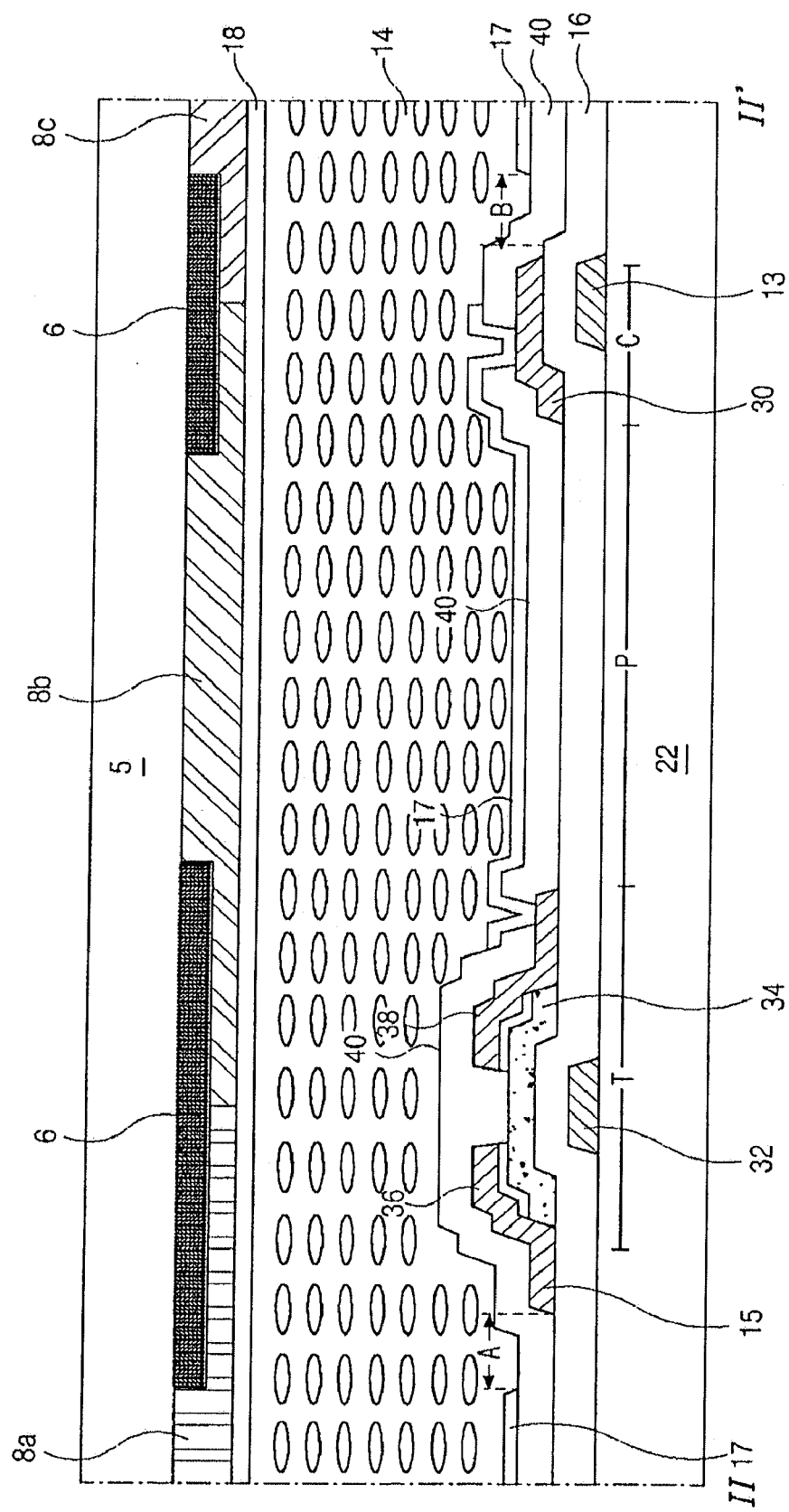
FIG. 2 is a schematic cross-sectional view taken along line II-II of FIG. 1, illustrating a pixel of the related art liquid crystal display device.
Figure 3:
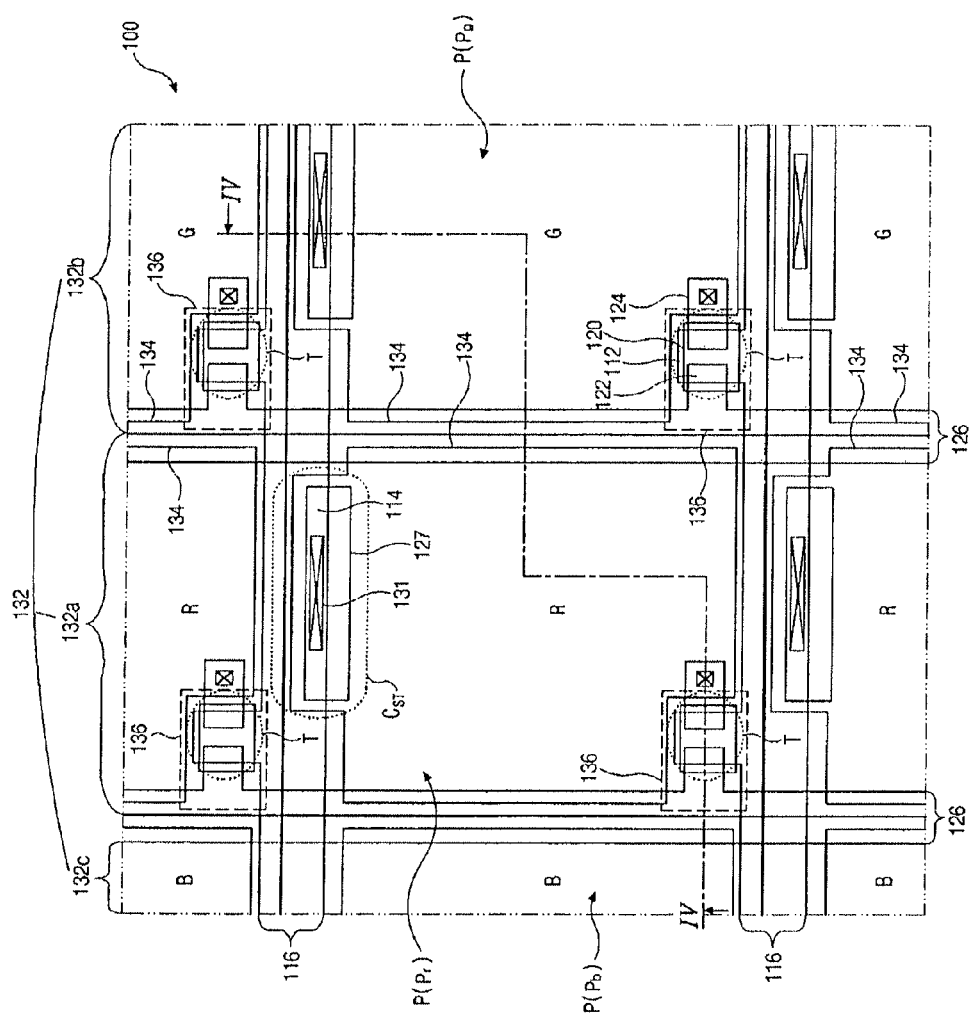
FIG. 3 is a partially enlarged plane view of an array substrate having a color filter on a thin film transistor structure according to a first embodiment of the present invention.

FIG. 3 is a partially enlarged plane view of an array substrate having a color filter on a thin film transistor structure according to a first embodiment of the present invention.

As shown in FIG. 3, an array substrate 100 includes a plurality of gate lines 116 disposed in a transverse direction and a plurality of data lines 126 disposed in a longitudinal direction. The plurality of gate lines 116 and the plurality of data lines 126 cross one another and define pixel regions P. A thin film transistor T is formed at each intersection of the gate line 116 and the data line 126. The thin film transistor T includes a gate electrode 112, an active layer 120, a source electrode 122, and a drain electrode 124. The gate electrode 112 extends from the gate line 116 and the source electrode 122 extends from the data line 126. The drain electrode 124 is spaced apart from the source electrode 122 across the gate electrode 112, and the active layer 120 having an island shape is disposed between the source electrode 122 and the drain electrode 124.

In the pixel regions P defined by the gate lines and data lines 116 and 126, a plurality of color filters 132a, 132b, and 132c are located therein. Additionally, a pixel electrode 134 is disposed corresponding to each pixel region P. The pixel electrode 134 overlaps the neighboring data lines 126 so that the high aperture ratio can be achieved. Further, the pixel electrode 134 overlaps a portion of the gate line 116 of the previous pixel to contact a storage capacitor $C_{ST}$. The pixel electrode 134 contacts the drain electrode 124 of the thin film transistor T so that it electrically communicates with the thin film transistor T.

Meanwhile, the storage capacitor $C_{ST}$ is included in a portion of the gate line 116, an insulator (not shown) and a storage metal layer 127. Thus, the portion of the gate line 116 acts as a first electrode of the storage capacitor $C_{ST}$, and the storage metal layer 127 acts as a second electrode of the storage capacitor $C_{ST}$. As mentioned above, the pixel electrode 134 electrically contacts the storage metal layer 127, so that it is electrically connected to the storage capacitor $C_{ST}$ in parallel.

The array substrate 100 of FIG. 3 has a color filter-on-thin film transistor (COT) structure. In such a COT structure, the color filters 132 are formed on the array substrate 100. Furthermore, a black matrix is not formed on the array substrate 100 but light-shielding color filter patterns 136 are disposed to correspond to the thin film transistors T, so that each light-shielding color filter pattern 136 protects the thin film transistor T from incident light and prevents photo current from being generated in the active layer 120. Although not shown in FIG. 3, each light-shielding color filter pattern 136 contains two or three layers of colored resin pattern. The thickness of the light-shielding color filter pattern 136 is almost the same as that of each color filter 132. Since the black matrix for preventing incident light is not utilized when forming the array substrate 100, the number of process steps is decreased and process stability is achieved.

Figure 4:
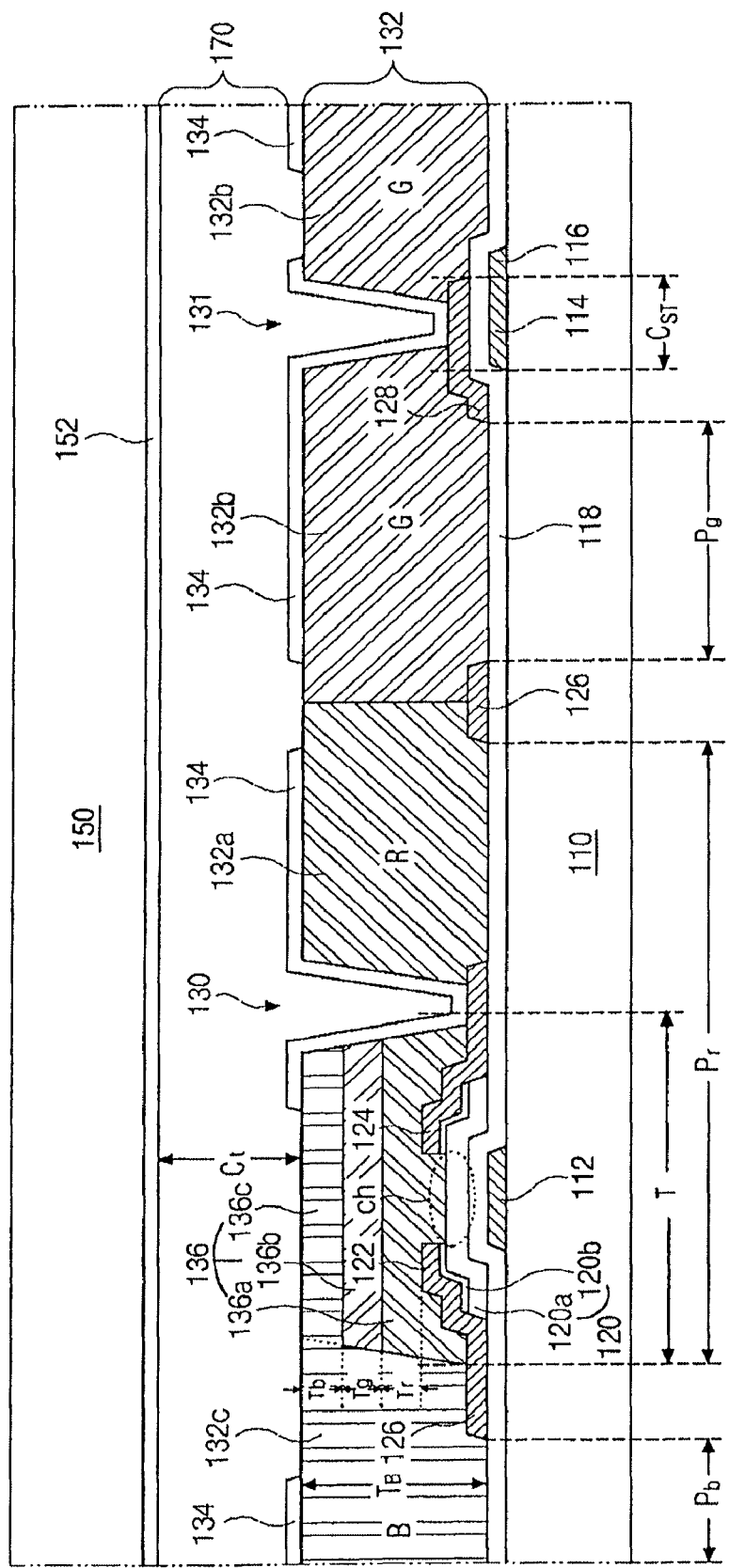
FIG. 4 is a cross sectional view taken along a line IV-IV of FIG. 3 and illustrates an embodiment of a liquid crystal display according to the present invention.

FIG. 4 is a cross sectional view taken along a line IV-IV of FIG. 3 and illustrates an embodiment of a liquid crystal display according to the present invention.

In FIG. 4, a gate electrode 112 is formed on a first substrate 110, and a gate electrode 116 having a first capacitor electrode 114 is also formed on the first substrate 110. Although not shown in FIG. 4 but shown in FIG. 3, the gate electrode 112 extends from the gate line 116. A gate insulating layer 118 is formed on the substrate to cover the gate electrode 112, the first capacitor electrode 114 and the gate line 116. An active layer 120a of amorphous silicon is formed on the gate insulating layer 118 especially above the gate electrode 112, and an ohmic contact layer 120b of impurity-doped amorphous silicon is formed on the active layer 120a. Those active layer 120a and ohmic contact layer 120b constitute a semiconductor layer 120. Source and drain electrodes 122 and 124 are formed to cover the ohmic contact layer 120b of the semiconductor layer 120. The source and drain electrodes 122 and 124 are spaced apart from each other across the gate electrode 112. The source electrode 122 is connected to a data line 126 that define a pixel region P with the gate line 116. Over the first capacitor electrode 114, a second capacitor electrode 128 that has an island shape is formed. The first capacitor electrode 114 and the second capacitor electrode 128 form a storage capacitor $C_{ST}$ with the interposed gate insulating layer 118.

Between the source and drain electrodes 122 and 124, a portion of the ohmic contact layer 120b is etched out so that a channel ch is formed on an exposed portion of the active layer 120a. The gate electrode 112, the semiconductor layer 120, the source and drain electrode 122 and 124 constitute a thin film transistor T. A color filter layer 132 having red (R) 132a, green (G) 132b and blue (B) 132c colors are formed in the pixel region P. Namely, the red (R) 132a, green (G) 132b and blue (B) 132c color filters are disposed respectively in a red pixel region $P_r$, a green pixel region $P_g$ and a blue pixel region $P_b$. The color filter layer 132 has a drain contact hole 130 that exposes a portion of the drain electrode 124. Furthermore, the color filter layer 132 has a capacitor contact hole 131 that exposes a portion of the second capacitor electrode 128. A pixel electrode 134 is formed on each color filter 132a, 132b or 132c, and disposed within each pixel region $P_r$, $P_g$ or $P_b$. The pixel electrode 134 contacts the drain electrode 124 and the second capacitor electrode 128, respectively, through the drain contact hole 130 and through the capacitor contact hole 131.

Meanwhile, a light-shielding color filter pattern 136 is disposed on the thin film transistor T. The light-shielding color filter pattern 136 contains red, green and blue color filter patterns 136a, 136b and 136c that are sequentially layered on the thin film transistor T. The red color filter pattern 136a is formed with the red color filter 132a, the green color filter pattern 136b is formed with the green color filter 132b, and the blue color filter pattern 136c is formed with the blue color filter 132c. In FIG. 4, the red color filter pattern 136a is formed as one united body with the neighboring red color filter 132a, and the blue color filter pattern 136c is also formed as one united body with the neighboring blue color filter 132c.

Still in FIG. 4, a second substrate 150 is disposed spaced apart from and facing the first substrate 110. On a rear surface of the second substrate 150, a common electrode 152 is formed. A liquid crystal layer 170 is interposed between the first and second substrates 110 and 150. The thickness of the liquid crystal layer 170 is called the cell gap.

In FIG. 4, the light-shielding color filter patterns 136 have three color filter patterns 136a, 136b and 136c and protect the thin film transistor T from incident light. When forming the color filters 132a, 132b and 132c, the light-shielding color filter pattern 136 is also formed. Thus, the black matrix that prevents the light incident to the thin film transistor is not required. Since the light-shielding color filter pattern 136, which prevents incident light in a manner similar to that of a black matrix, is formed with the color filter layer 132, the number of process steps can be reduced.

The thickness of the light-shielding color filter pattern 136 is the same as or less than the thickness of each color filter 132 that is in each pixel region $P_r$, $P_g$ or $P_b$. Moreover, the thickness of the light-shielding color filter pattern 136 is adjusted using a diffraction exposure method during the fabrication process. If the thickness of the red, green and blue color filters 132a, 132b and 132c are denoted by $T_R$, $T_G$ and $T_B$ and if the thickness of the red, green and blue color filter patterns 136a, 136b and 136c are denoted by $T_r$, $T_g$ and $T_b$, the relationship between the color filters 132 and the color filter patterns 136 can be represented by the following inequalities.

$$T_r<T_R, T_g \leqq T_G \text{ and } T_b \leqq T_B$$

$$T_g<T_G, T_r \leqq T_R \text{ and } T_b \leqq T_B$$

$$T_b<T_B, T_g \leqq T_G \text{ and } T_r \leqq T_R$$

Furthermore, if the cell gap between the light-shielding color filter pattern 136 and the common electrode 152 is denoted by $C_t$, the cell gap should be greater than zero, i.e., $C_t>0$.

When the red, green and blue color filters 132a, 132b and 132c are sequentially formed, the accumulation order of red, green and blue color filter patterns 136a, 136b and 136c can be applied to all of the array substrate.

Figure 5:
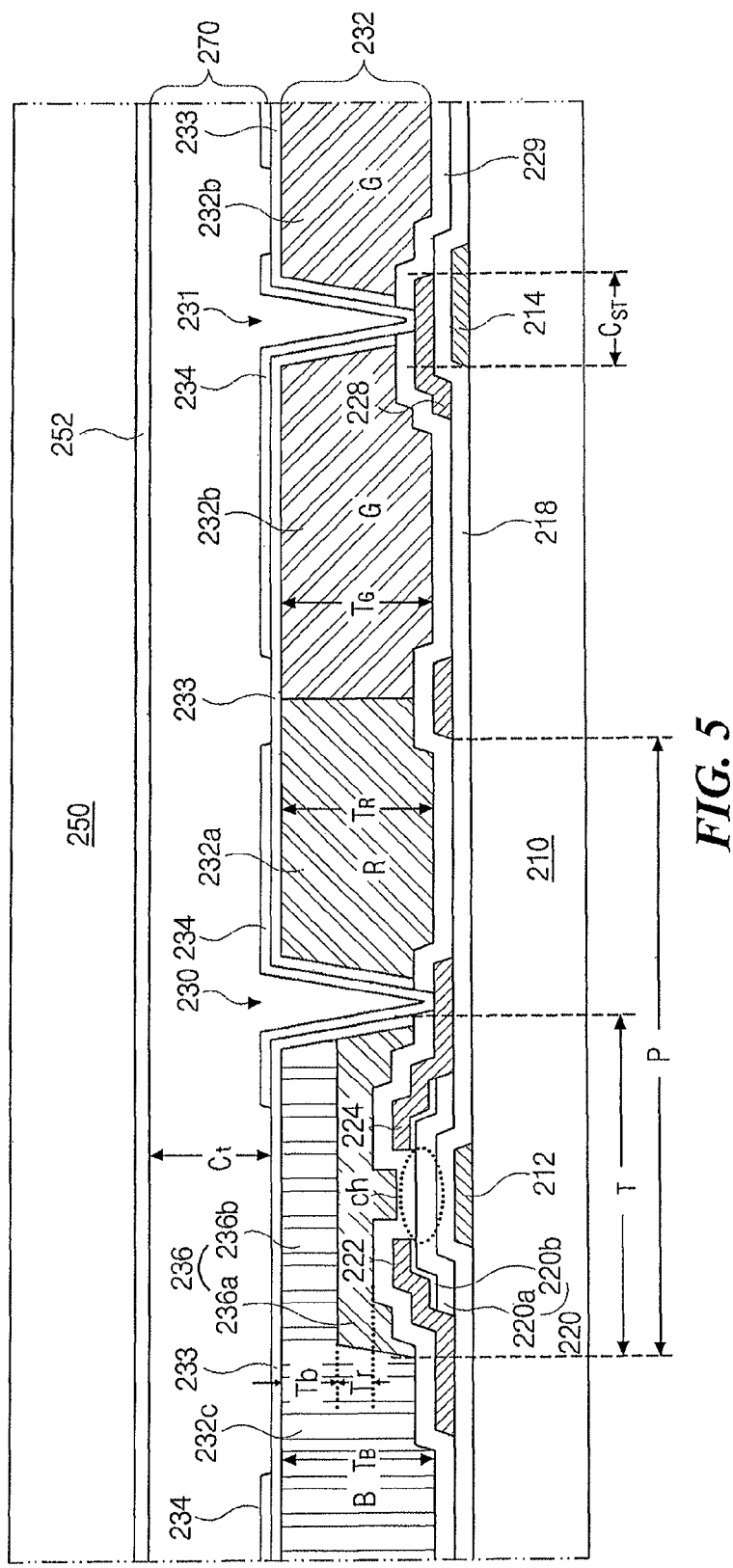
FIG. 5 is a cross sectional view and illustrates another embodiment of a liquid crystal display according to the present invention.

FIG. 5 is a cross sectional view that illustrates another embodiment of a liquid crystal display according to the present invention. In FIG. 5, the light-shielding color filter pattern has different structure and configuration than that shown in FIG. 4. Since the liquid crystal display of FIG. 5 is similar to that of FIG. 4, some explanation will be omitted hereinafter.

In FIG. 5, a thin film transistor T having a gate electrode 212, a semiconductor layer 220, a source electrode 222 and a drain electrode 224 is formed on a first substrate 210. Further, a storage capacitor $C_{ST}$ having a first capacitor electrode 214, a gate insulating layer 218 and a second capacitor electrode 228 is also formed on the first substrate 210. Red, green and blue color filters 232a, 232b and 232c are also formed in the pixel regions P over the storage capacitor $C_{ST}$ and the thin film transistor T. The color filter layer 232 has a drain contact hole 230 exposing a portion of the drain electrode 224 and a capacitor contact hole 232 exposing a portion of the second capacitor electrode 228. A pixel electrode 234 is formed on each of color filter 232a, 232b or 232c and contacts the drain electrode 224 and the second capacitor electrode 228, respectively, through the drain contact hole 230 and through the capacitor contact hole 231.

Meanwhile, a second substrate 250 is spaced apart from the first substrate 210. A common electrode 252 is formed on a rear surface of the second substrate 250. A liquid crystal layer 270 is interposed between the pixel electrode 234 and the common electrode 252.

A light-shielding color filter pattern 236 having a red color filter pattern 236a and a blue color filter pattern 236b is formed right above the thin film transistor T. Unlike the light-shielding color filter pattern 136 of FIG. 4, the light-shielding color filter pattern 236 of FIG. 5 has two-layered color filter patterns 236a and 236b. Moreover, the color filter patterns 236a and 236b can be red and green or green and blue. The red, green and blue color filters 232a, 232b and 232c are formed throughout a photolithography process using photo-sensitive resins. Therefore, the red color filter pattern 236a is formed when forming the red color filter 232a and the blue color filter pattern 236b is formed when forming the blue color filter 232c. As shown in the embodiment illustrated in FIG. 5, when forming the green color filter 232b, no color filter pattern is formed over the thin film transistor T.

If the thickness of the red, green and blue color filters 232a, 232b and 232c are denoted by $T_R$, $T_G$ and $T_B$ and if the thickness of the red and blue color filter patterns 236a and 236b are denoted by $T_r$ and $T_b$, the relationship between the color filters 232 and the color filter patterns 236 can be represented by the following inequalities.

$$T_r<T_R, \text{ and/or } T_b \leqq T_B$$

$$T_r \leqq T_R \text{ and/or } T_b \leqq T_B$$

$$T_b<T_B \text{ and/or } T_r \leqq T_R$$

Furthermore, if the cell gap between the light-shielding color filter pattern 236 and the common electrode 252 is denoted by $C_t$, the cell gap $C_t$ should be greater than zero, i.e., $C_t>0$.

In order to form the red and blue color filter patterns 236a and 236b to have relatively small thickness $T_r$ and $T_b$, a diffraction exposure method that decreases the dose of light irradiation is advantageously used.

It is possible that an additional insulator is interposed between the thin film transistor and the color filter layer. When forming the additional insulator, the additional insulator should have a drain contact hole exposing the drain electrode and a capacitor contact hole exposing the second capacitor electrode, whereas the pixel electrode electrically contacts with the thin film transistor and the storage capacitor. For example, an additional insulating layer 229 may be between the thin film transistors T and the light-shielding color filter patterns 236 and between the gate insulating layer 218 and the color filters 232a, 232b and 232c. Further, another additional insulating layer 233 may be between the color filters 232a, 232b and 232c and the pixel electrodes 234.

FIGS. 6A to 6J are cross-sectional views taken along a line IV-IV of FIG. 3, and illustrates the process steps of fabricating the array substrate having a light-shielding color filter pattern according to an embodiment of the present invention.

Figure 6A:
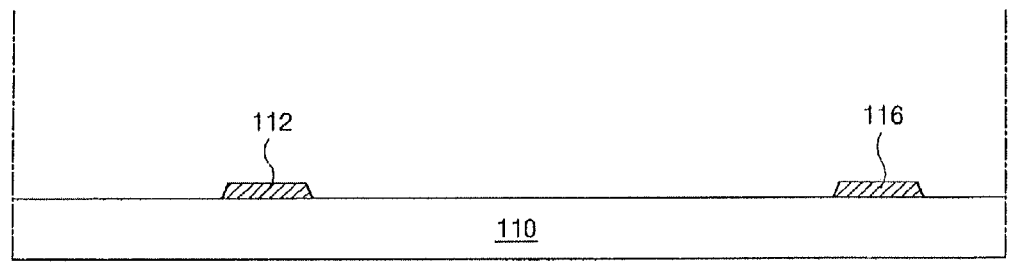
FIGS. 6A to 6J are cross-sectional views taken along a line IV-IV of FIG. 3, and illustrates the process steps of fabricating the array substrate having a light-shielding color filter pattern according to an embodiment of the present invention.

In FIG. 6A, a first metal layer is deposited on the surface of a substrate 110, and then patterned to form a gate line 116 and a gate electrode 112. As described herein before, a portion of the gate line 116 acts as a first capacitor electrode 114 that constitutes a storage capacitor with a later-formed second capacitor electrode.

Figure 6B:
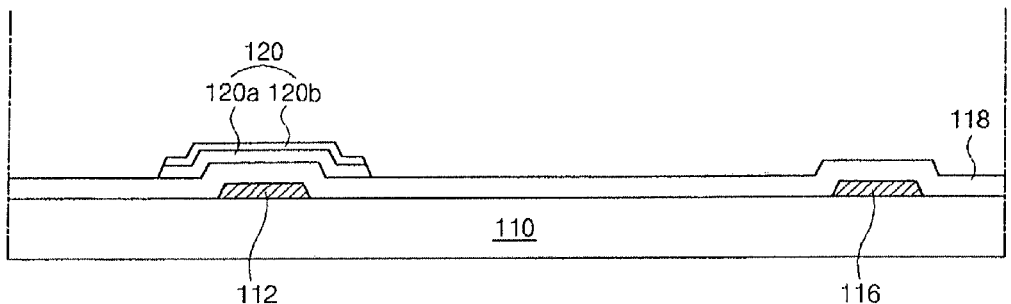

In FIG. 6B, a gate insulating layer 118 (a first insulating layer) is formed on the substrate 110 to cover the gate line 116 and the gate electrode 112. The gate insulation layer 118 is formed of an inorganic material, such as silicon nitride ($SiN_x$) and silicon oxide ($SiO_2$). An intrinsic amorphous silicon layer (a-Si:H) and then an $n^+$-doped amorphous silicon layer ($n^+$ a-Si:H) are sequentially deposited on the entire surface of the gate insulation layer 118 and then simultaneously patterned through a mask process to form an active layer 120a and an ohmic contact layer 120b. The active layer 120a is located above the gate electrode 112, and the ohmic contact layer 120b is then located on the active layer 120a. The active layer 120a and the ohmic contact layer 120b constitute a semiconductor layer 120.

Figure 6C:
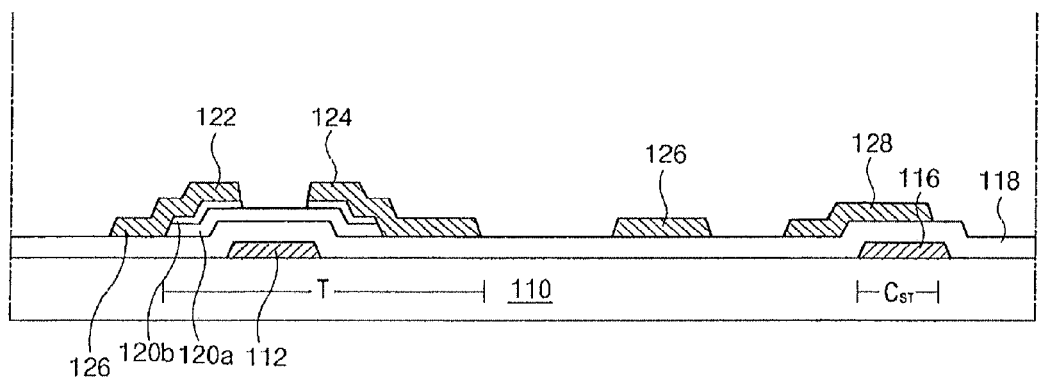

In FIG. 6C, after forming the active layer 120a and the ohmic contact layer 120b, a second metal layer is deposited over the substrate 110, and then patterned through a mask process to form a source electrode 122, a drain electrode 124, a data line 126, and a second capacitor electrode 128. The second metal layer may be formed of one of chromium (Cr), copper (Cu), molybdenum (Mo), and an alloy of any combination thereof. The source electrode 122 extends from the data line 126 and contacts one portion of the ohmic contact layer 120a. The drain electrode 124 is spaced apart from the source electrode 122 and contacts the other portion of the ohmic contact layer 120a. The second capacitor electrode 128 overlaps a portion of the gate line 116 so that the overlapped portion of the gate line 116 becomes the first second capacitor electrode 128. Thereafter, a portion of the ohmic contact layer 120*b* between the source and drain electrodes 122 and 124 is etched to exposed the active layer 120*a* by using the source and drain electrodes 122 and 124 as masks, whereas a thin film transistor T and a storage capacitor $C_{ST}$ are complete. As described with reference to FIGS. 3 and 4, the thin film transistor T is comprised of the gate electrode 112, the semiconductor layer 120, the source electrode 122, and the drain electrode 124. And the storage capacitor $C_{ST}$ is comprised of the portion of the gate line 116, the second metal layer 128, and the interposed first insulating layer 118.

Figure 6D:
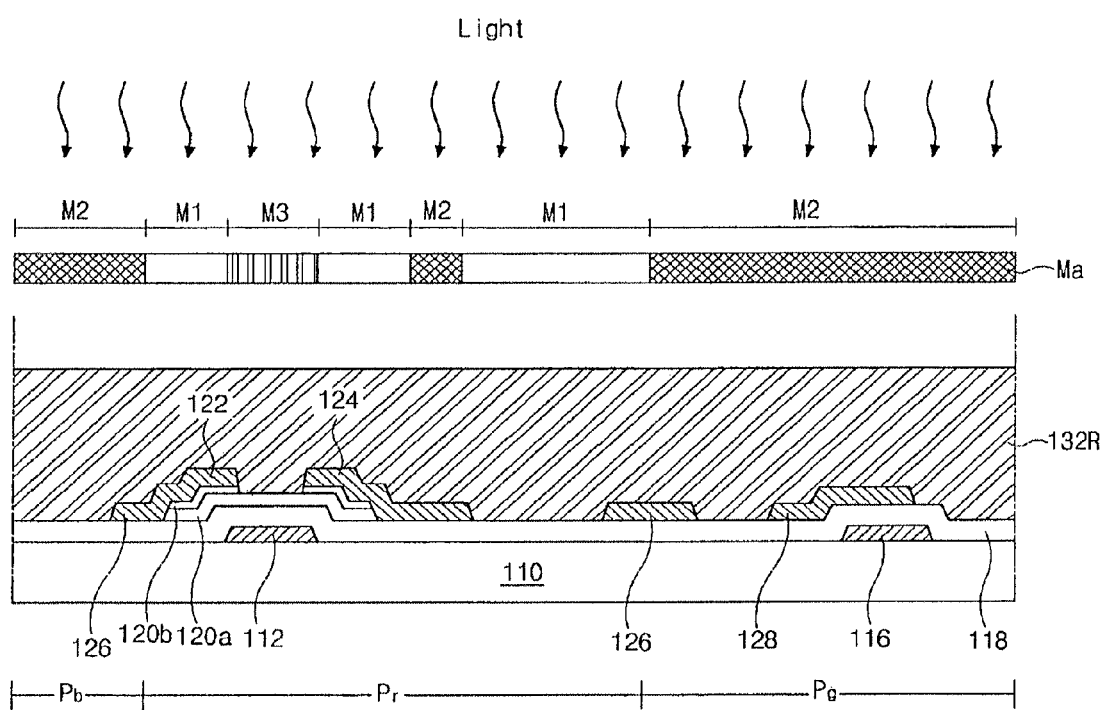

In FIG. 6D, a red color resin 132R is formed over the entire surface of the substrate 110 to cover the thin film transistor T, the storage capacitor $C_{ST}$, and the data line 126. Thereafter, a first mask Ma is disposed over the substrate 110 to pattern the red color resin 132R. The first mask Ma has transmitting portions M1, shielding portions M2 and half-transmitting portions M3. The transmitting portions M1 allow the light to fully pass through and correspond to the pixel region P except for the portions for thin film transistor region T. Especially in this process of patterning the red color resin 132R, the transmitting portions M1 correspond to the red pixel region $P_r$. The shielding portion M2 thoroughly blocks the light during this mask process and corresponds to the other green and blue pixel regions $P_g$ and $P_b$. The half-transmitting portion M3 includes a plurality of slits or a semitransparent film so that only a portion of the light can pass through. The half-transmitting portion M3 corresponds to the gate electrode 112, especially to the exposed portion of the active layer 120*a*.

Figure 6E:
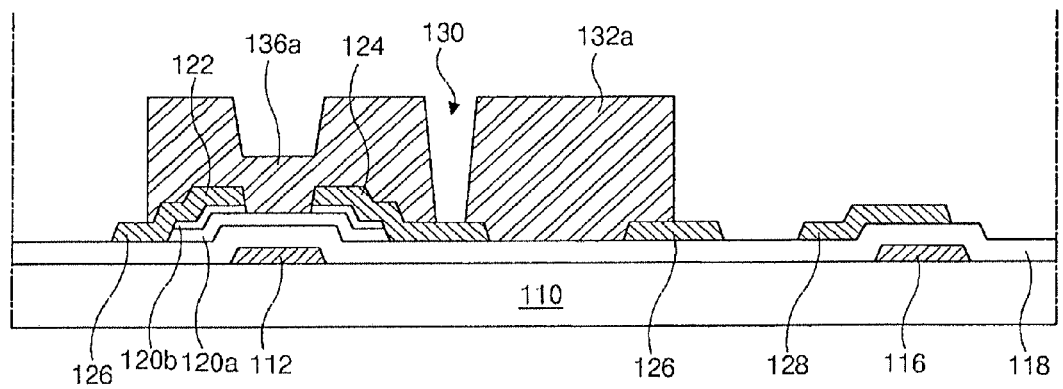

After the light irradiation through the first mask Ma as shown in FIG. 6D, the red color resin 132R is developed so that a red color filter 132*a* and a red color filter pattern 136*a* are left over the substrate 110. As shown in FIG. 6E, the red color filter 132*a* corresponds to the red pixel region $P_r$ and has a drain contact hole 130 that exposes a portion of the drain electrode 124. Although not shown in FIG. 6E, the red color filter 132*a* has a capacitor contact hole that exposes a second capacitor electrode corresponding to the red pixel region $P_r$. Additionally, the red color filter pattern 136*a* is disposed above the gate electrode 112 especially on the exposed potion of the active layer 120*a*.

Figure 6F:
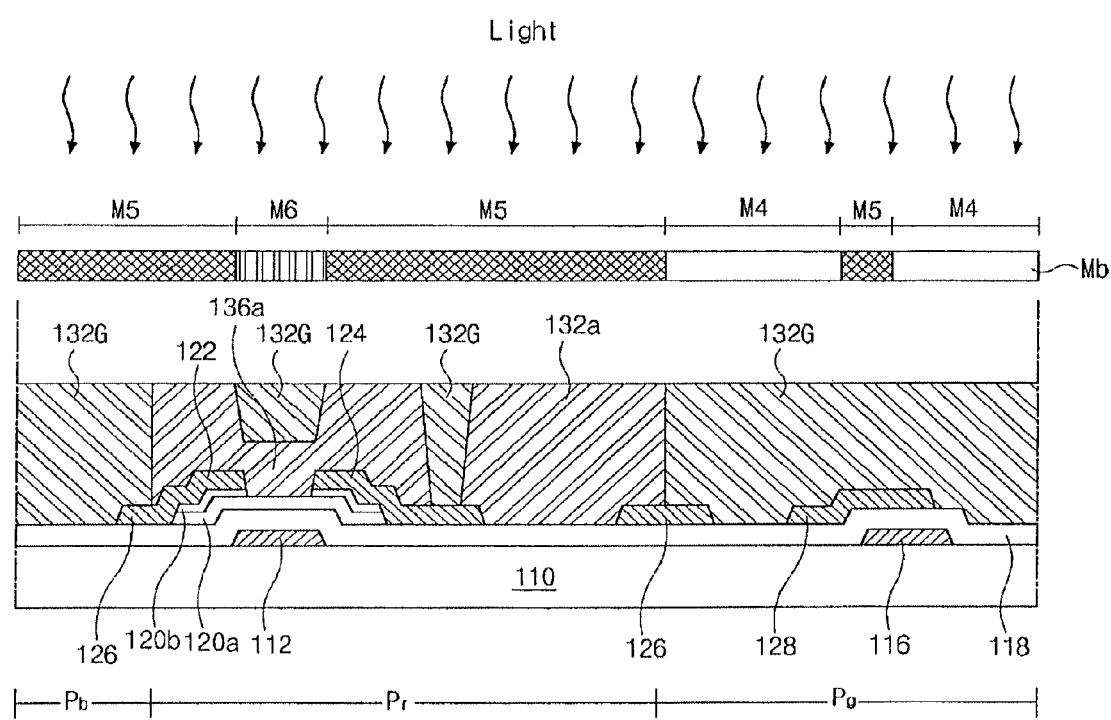

Now in FIG. 6F, after forming the red color filter 132*a* and the red color filter pattern 136*a*, a green color resin 132G is formed over the entire surface of the substrate 110, and then a second mask Mb is disposed over the substrate 110 for patterning the green color resin 132G. Similar to the first mask Ma, the second mask Mb has transmitting portions M4 corresponding to the green pixel region $P_g$, shielding portions M5 corresponding to the other red and blue pixel regions $P_r$ and $P_b$, and half-transmitting portions M6 corresponding to the exposed portion of the active layer 120*a*. A shielding portion M5 also corresponds to the second capacitor electrode 128. After disposing the second mask Mb over the green color resin 132G, the light irradiation is performed through the second mask Mb for patterning the green color resin 132G.

Figure 6G:
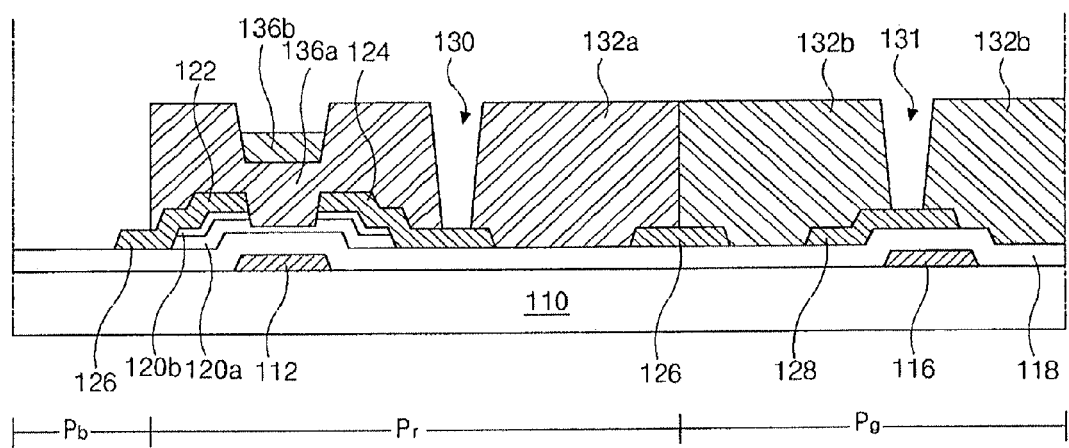

After the light irradiation through the second mask Mb, the green color resin 132G is developed. Therefore, as shown in FIG. 6G, a green color filter 132*b* is formed to be disposed in the green pixel region $P_g$, and a green color filter pattern 136*b* is also formed on the red color filter pattern 136*a*. Meanwhile, at this time of developing the green color resin 132G, the green color filter 132*b* is formed to have a capacitor contact hole 131 that exposes, a portion of the second capacitor electrode 128. Furthermore, although not shown in FIG. 6G, a drain contact hole that exposes a drain electrode of the thin film transistor corresponding to the green pixel region $P_g$ is also formed.

Figure 6H:
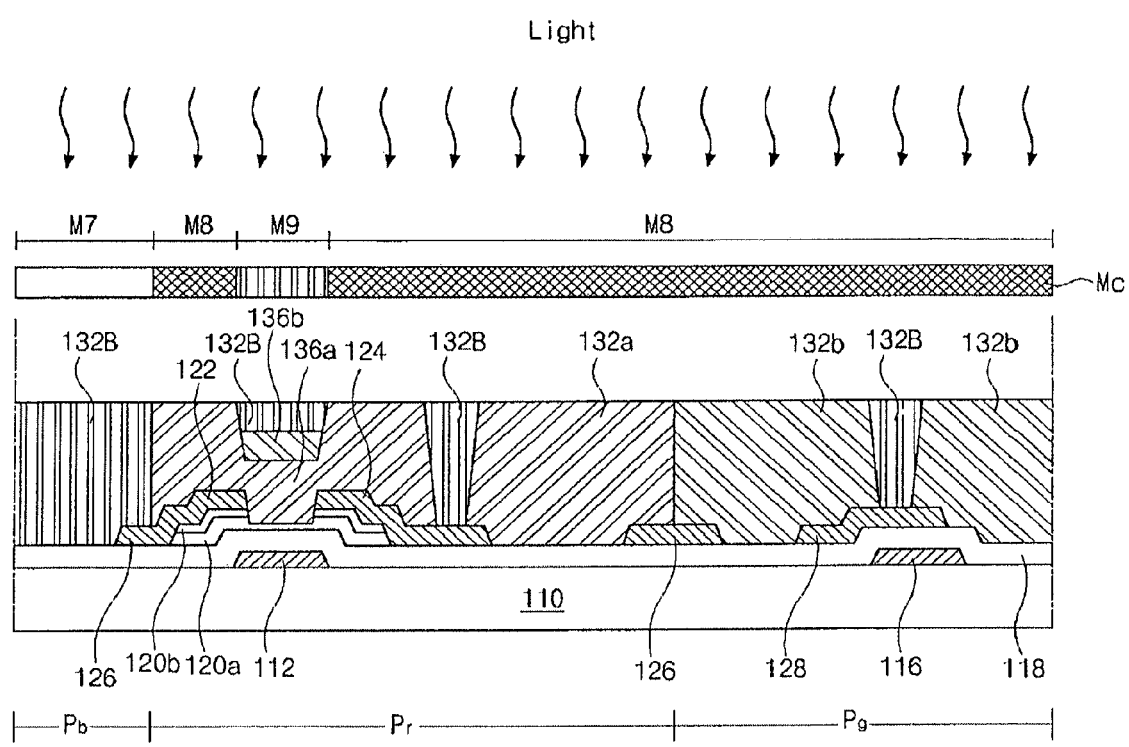

Next in FIG. 6H, a blue color resin 132B is formed over the entire surface of the substrate 110, and then a third mask is disposed over the substrate 110 for patterning the blue color resin 132B. Similarly to the first and second masks Ma and Mb, the third mask Mc has transmitting portions M7 corresponding to the blue pixel region $P_b$, shielding portions M8 corresponding to the other red and green pixel regions $P_r$ and $P_g$, and half-transmitting portions M9 corresponding to the active layer 120*a*. Although not shown in FIG. 6H, a shielding portion M5 also corresponds to the second capacitor electrode 128 corresponding to the blue pixel region $P_b$. After disposing the third mask Mc over the blue color resin 132B, the light irradiation is performed through the third mask Mc for patterning the blue color resin 132B.

Figure 6I:
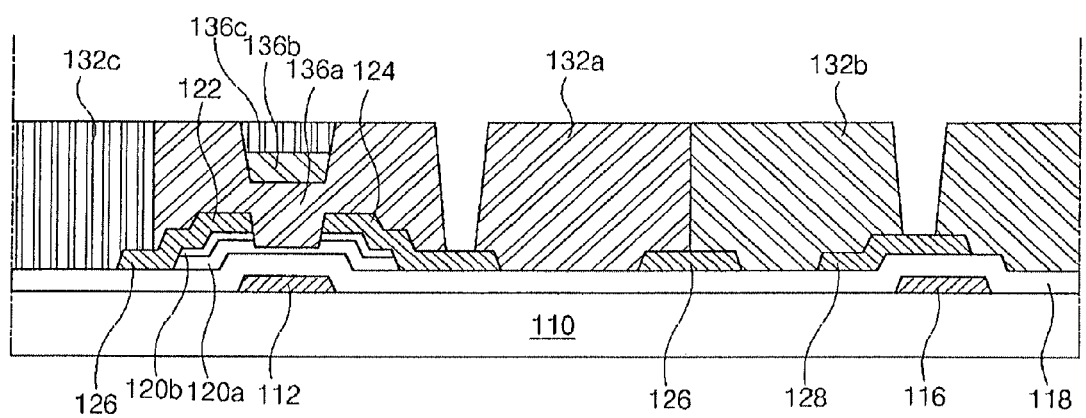

After the light irradiation through the third mask Mc, the blue color resin 132B is developed. Therefore, as shown in FIG. 6I, a blue color filter 132*c* is formed to be disposed in the blue pixel region $P_b$, and a blue color filter pattern 136*c* is also formed on the green color filter pattern 136*b*. Although not shown in FIG. 6I, developing the blue color resin 132B forms the blue color filter 132*c* to have a capacitor contact hole that exposes a portion of a corresponding second capacitor electrode and a drain contact hole that exposes a portion of a corresponding drain electrode. Accordingly, the color filter layer 132 is complete as shown in FIG. 6I.

Figure 6J:
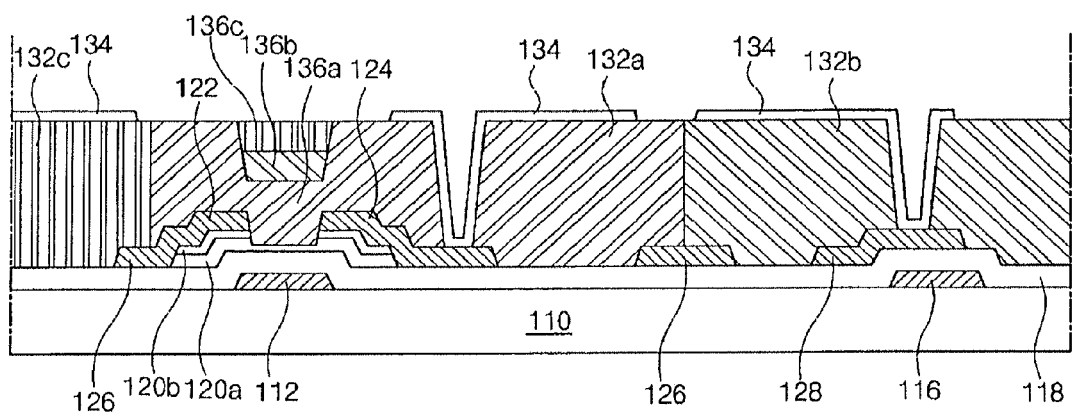

FIG. 6J shows the step of forming a pixel electrode 134. A transparent electrode layer of indium tin oxide (ITO) or indium zinc oxide (IZO) is deposited over the entire surface of the substrate 100 to cover the color filter layer 132 and contacts the exposed portions of the drain electrode 124 and the second capacitor electrode 128. Thereafter, the transparent electrode layer is patterned through a mask process, so that the pixel electrode 134 is formed to correspond to each pixel region $P_r$, $P_g$ or $P_b$. As shown in FIG. 6J, the pixel electrode 134 contacts the drain electrode 134 and the second capacitor electrode 128.

FIGS. 7A to 7L are cross-sectional views taken along a line IV-IV of FIG. 3, and illustrates the process steps of fabricating the array substrate having a light-shielding color filter pattern according to another embodiment of the present invention.

Figure 7A:
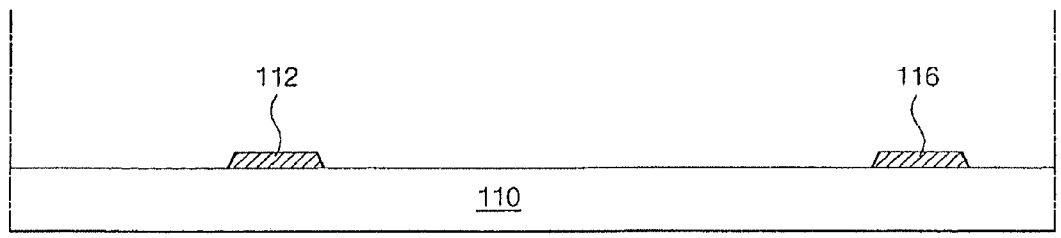
FIGS. 7A to 7L are cross-sectional views taken along a line IV-IV of FIG. 3, and illustrates the process steps of fabricating the array substrate having a light-shielding color filter pattern according to another embodiment of the present invention.
Figure 7B:
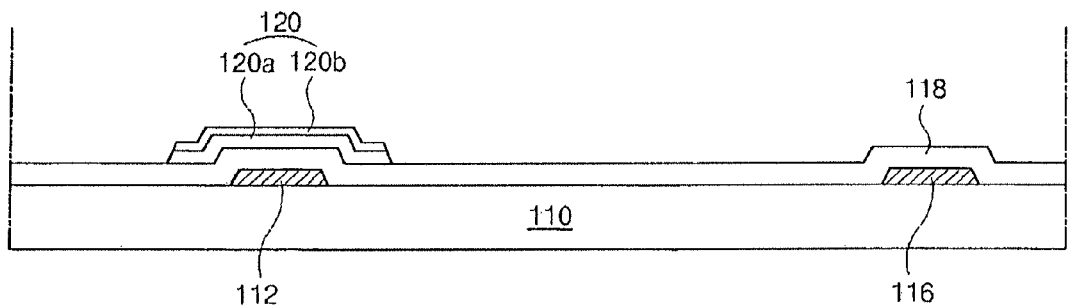
Figure 7C:
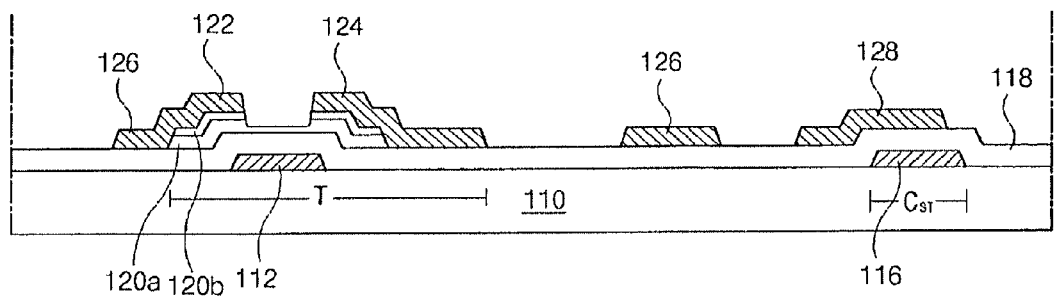

FIGS. 7A to 7C are the same as FIGS. 6A to 6C so that some detailed explanations are omitted hereinafter.

Figure 7D:
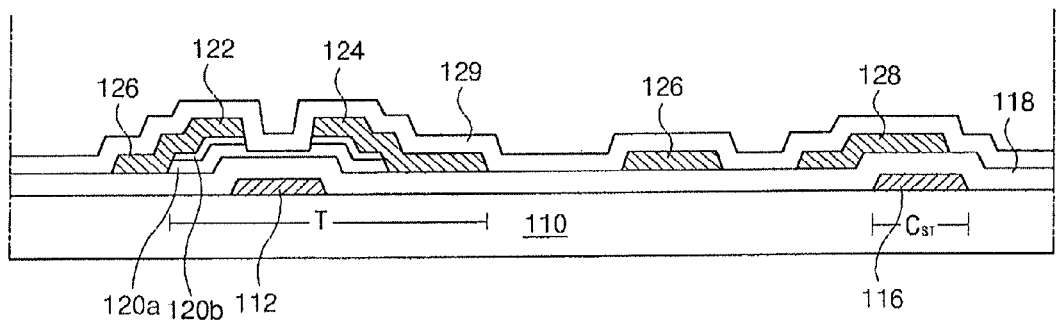

In FIG. 7D, a second insulating layer 129 is deposited over the entire surface of the substrate 110 to cover the patterned second metal layer. Namely, the second insulating layer 129 covers and protects the thin film transistor T, the gate line 126 and the storage capacitor $C_{ST}$. The second insulating layer 129 may be formed of silicon nitride ($SiN_x$) or silicon oxide ($SiO_2$). The second insulating layer 129 enhances the adhesion of an organic layer to be formed in the next process. In other words, the second insulating layer 129 improves the adhesion between the active layer 120*a* and the later-formed color filter layer.

Figure 7E:
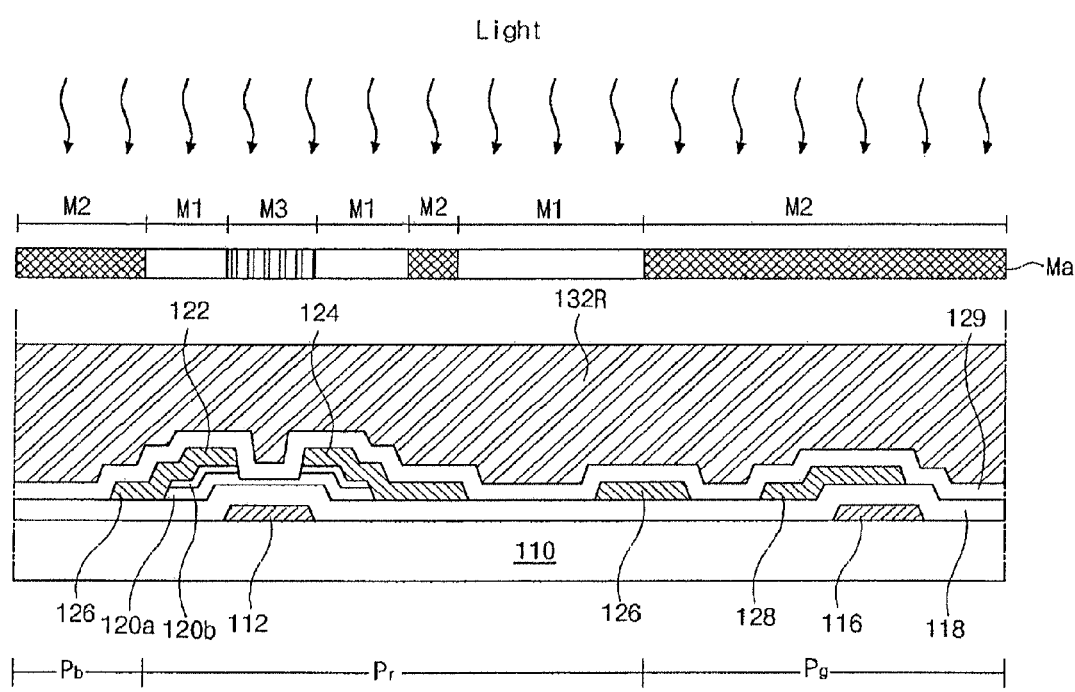

After forming the second insulating layer 129, a red color resin 132R is formed on the second insulating layer 129 as shown in FIG. 7E. A first mask Ma is then disposed over the substrate 110 to pattern the red color resin 132R. The first mask Ma has transmitting portions M1, shielding portions M2 and half-transmitting portions M3. The transmitting portions M1 allow the light to fully pass through and correspond to the pixel region P except for the portions for thin film transistor region T. Especially in this process of patterning the red color resin 132R, the transmitting portions M1 correspond to the red pixel region $P_r$. The shielding portion M2 thoroughly blocks the light during this mask process and corresponds to the other green and blue pixel regions $P_g$ and $P_b$. The half-transmitting portion M3 includes a plurality of slits or a semitransparent film so that only a portion of the light can pass through. The half-transmitting portion M3 corresponds to the gate electrode 112, especially to the exposed portion of the active layer 120a.

Figure 7F:
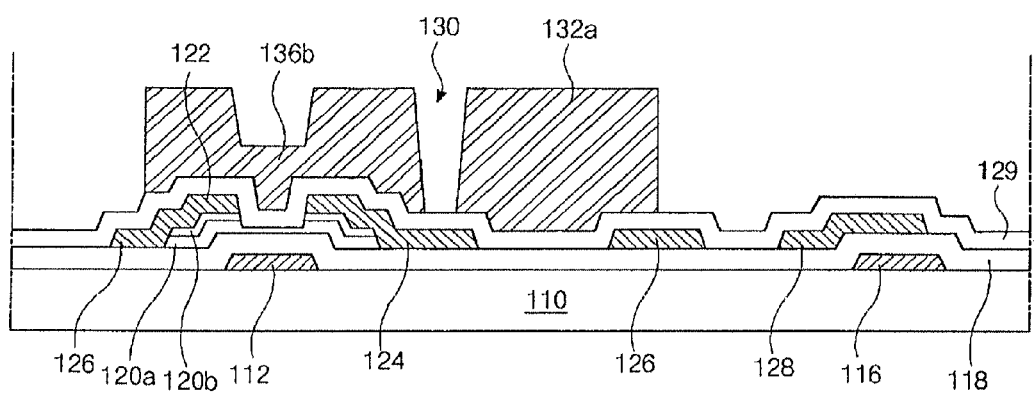

After the light irradiation through the first mask Ma of FIG. 7E, the red color resin 132R is developed so that a red color filter 132a and a red color filter pattern 136a are left on the second insulating layer 129. As shown in FIG. 7F, the red color filter 132a corresponds to the red pixel region $P_r$ and has a drain contact hole 130 that corresponds to the drain electrode 124. Although not shown in FIG. 7F, the red color filter 132a also has a capacitor contact hole that corresponds to a second capacitor electrode corresponding to the red pixel region $P_r$. Additionally, the red color filter pattern 136a is disposed on the second insulating layer especially above the gate electrode 112.

Figure 7G:
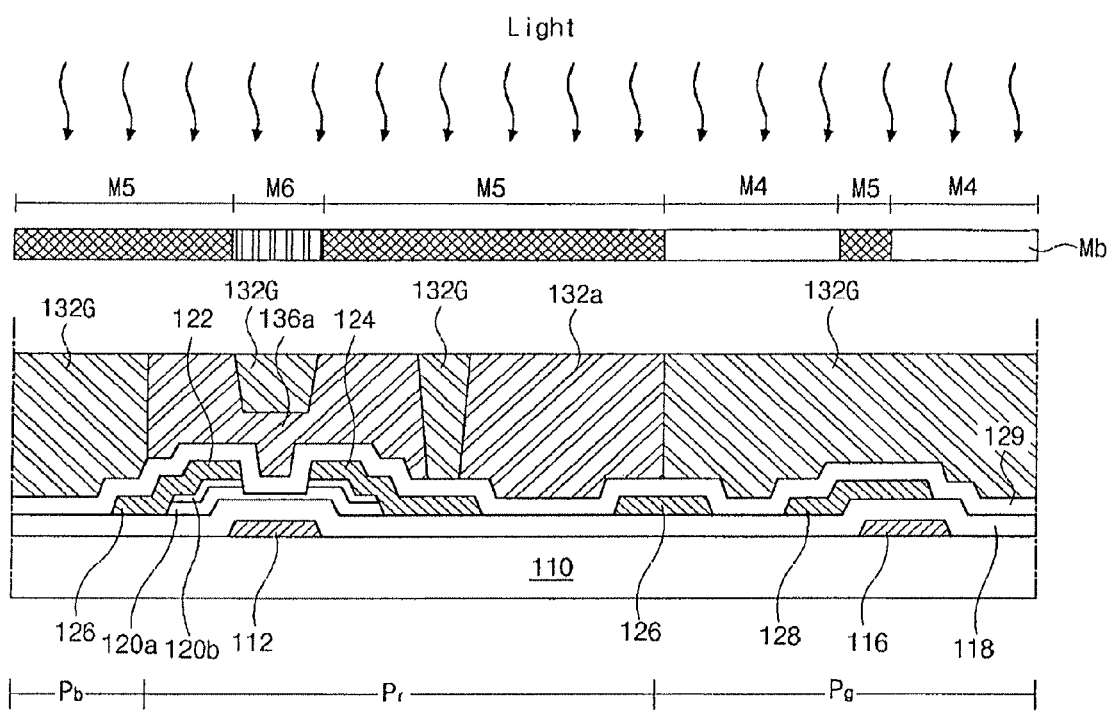

Now in FIG. 7G, after forming the red color filter 132a and the red color filter pattern 136a, a green color resin 132G is formed over the entire surface of the substrate 110 especially on the second insulating layer 129, and then a second mask Mb is disposed over the substrate 110 for patterning the green color resin 132G. Similar to the first mask Ma, the second mask Mb has transmitting portions M4 corresponding to the green pixel region $P_g$, shielding portions M5 corresponding to the other red and blue pixel regions $P_r$ and $P_b$, and half-transmitting portions M6 corresponding to the active layer 120a. A shielding portion M5 also corresponds to the second capacitor electrode 128. After disposing the second mask Mb over the green color resin 132G, the light irradiation is performed through the second mask Mb for patterning the green color resin 132G.

Figure 7H:
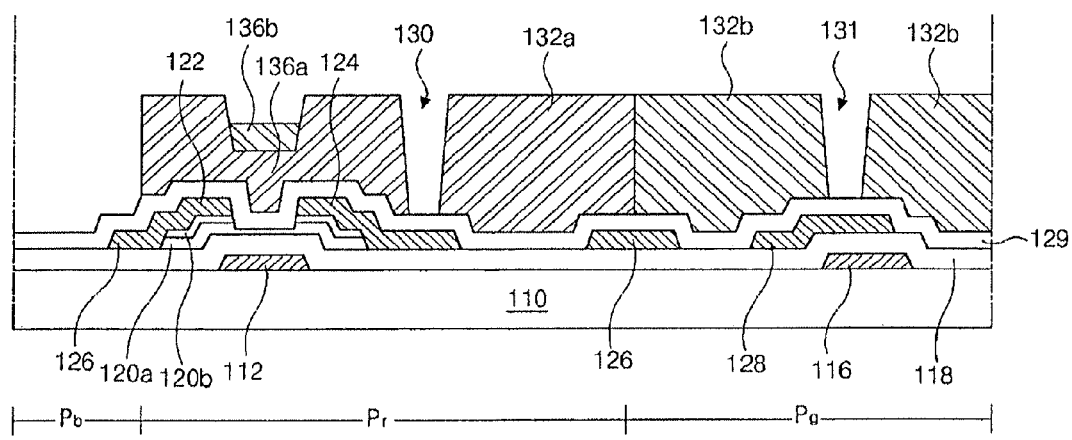

After the light irradiation through the second mask Mb, the green color resin 132G is developed. Therefore, as shown in FIG. 7H, a green color filter 132b is formed on the second insulating layer 129 to correspond to the green pixel region $P_g$, and a green color filter pattern 136b is also formed on the red color filter pattern 136a. Meanwhile, when developing the green color resin 132G, the green color filter 132b is formed to have a capacitor contact hole 131 that corresponds to the second capacitor electrode 128. Furthermore, although not shown in FIG. 7H, a drain contact hole that corresponds to a drain electrode of the thin film transistor corresponding to the green pixel region $P_g$ is also formed.

Figure 7I:
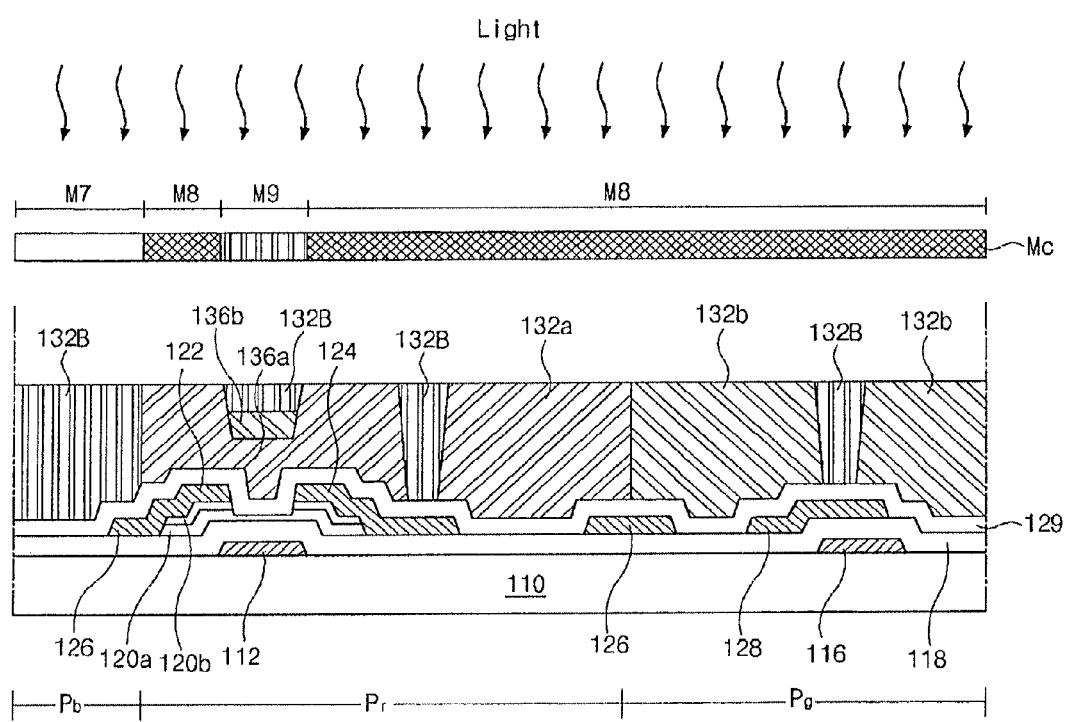

Next in FIG. 7I, a blue color resin 132B is formed over the entire surface of the substrate 110 especially on the second insulating layer 129, and then a third mask Mc is disposed over the substrate 110 for patterning the blue color resin 132B. Similar to the first and second masks Ma and Mb, the third mask Mc has transmitting portions M7 corresponding to the blue pixel region $P_b$, shielding portions M8 corresponding to the other red and green pixel regions $P_r$ and $P_g$, and half-transmitting portions M9 corresponding to the active layer 120a. Although not shown in FIG. 7I, a shielding portion M5 also corresponds to the second capacitor electrode corresponding to the blue pixel region $P_b$. After disposing the third mask Mc over the blue color resin 132B, the light irradiation is performed through the third mask Mc for patterning the blue color resin 132B.

Figure 7J:
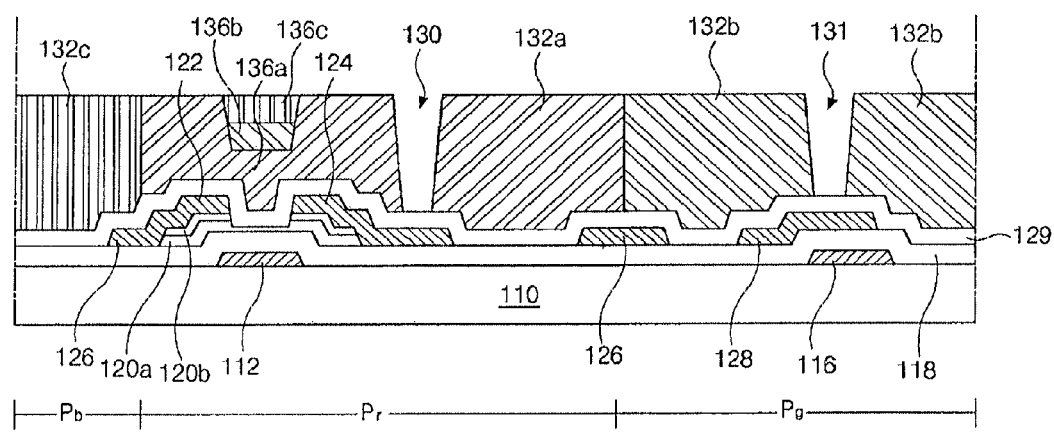

After the light irradiation through the third mask Mc, the blue color resin 132B is developed. Therefore, as shown in FIG. 7J, a blue color filter 132c is formed to be disposed in the blue pixel region $P_b$, and a blue color filter pattern 136c is also formed on the green color filter pattern 136b. Meanwhile, although not shown in FIG. 7J, developing the blue color resin 132B forms the blue color filter 132c to have a capacitor contact hole corresponding to a corresponding second capacitor electrode and a drain contact hole corresponding to a corresponding drain electrode. Accordingly, the color filter layer 132 is complete as shown in FIG. 6J.

Figure 7K:
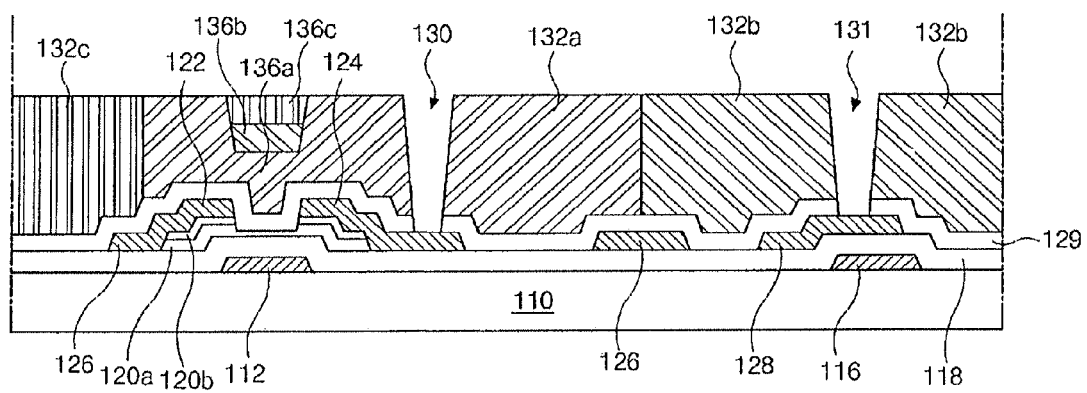

After completing the color filter layer 132, the drain contact hole 130 and the capacitor contact hole 131 extend to the underlying metal layer. As shown in FIG. 7K, exposed portions of the second insulating layer 129 are etched so that the drain and capacitor contact holes 130 and 131 extend to the underlying drain electrode 124 and second capacitor electrode 128, respectively. The drain contact hole 130 exposes a portion of the drain electrode 124, and the capacitor contact hole 131 exposes a portion of the second capacitor electrode 128.

Figure 7L:
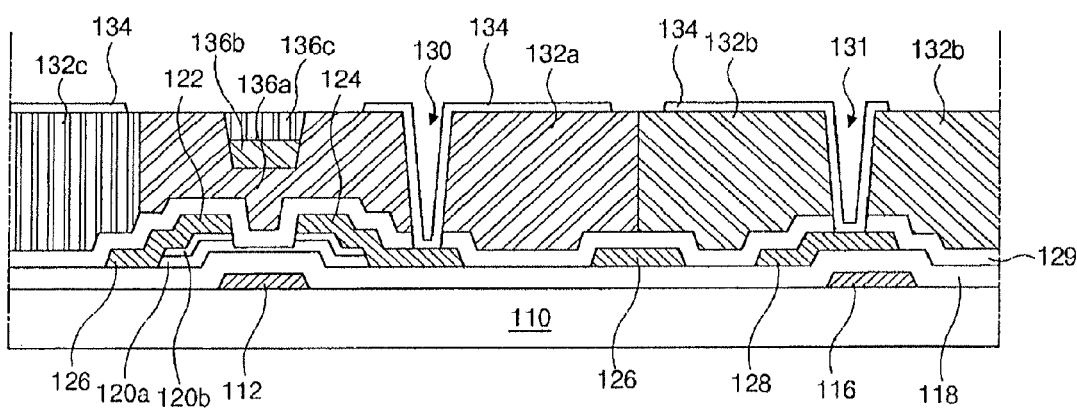

FIG. 7L shows the step of forming a pixel electrode 134. A transparent electrode layer of indium tin oxide (ITO) or indium zinc oxide (IZO) is deposited over the entire surface of the substrate 100 to cover the color filter layer 132 and to contact the exposed portions of the drain electrode 124 and the second capacitor electrode 128. Thereafter, the transparent electrode layer is patterned through a mask process, so that the pixel electrode 134 is formed to correspond to each of the pixel regions $P_r$, $P_g$ and $P_b$. As shown in FIG. 7L, the pixel electrode 134 contacts the drain electrode 134 and the second capacitor electrode 128, respectively, through the drain contact hole 130 and the capacitor contact hole 131.

Figure 8A:
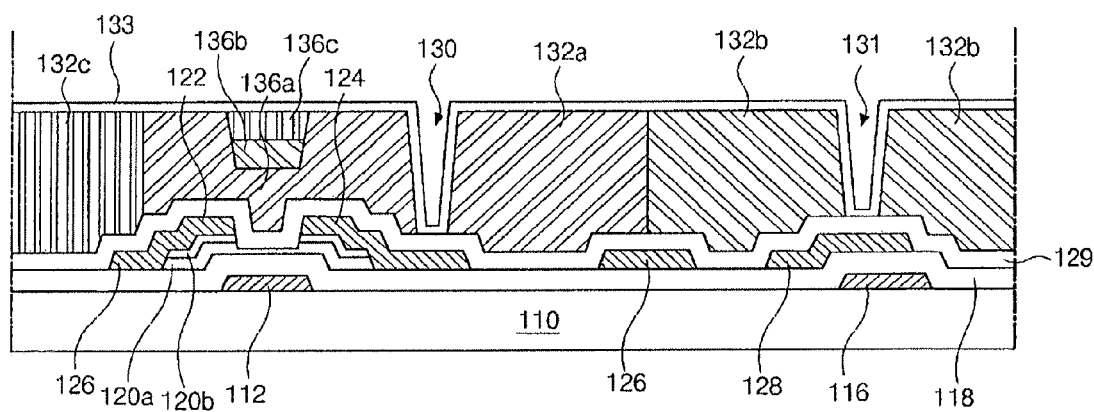
FIGS. 8A to 8C are cross-sectional views illustrating the process steps of fabricating the array substrate having a light-shielding color filter pattern according to another embodiment of the present invention.
Figure 8B:
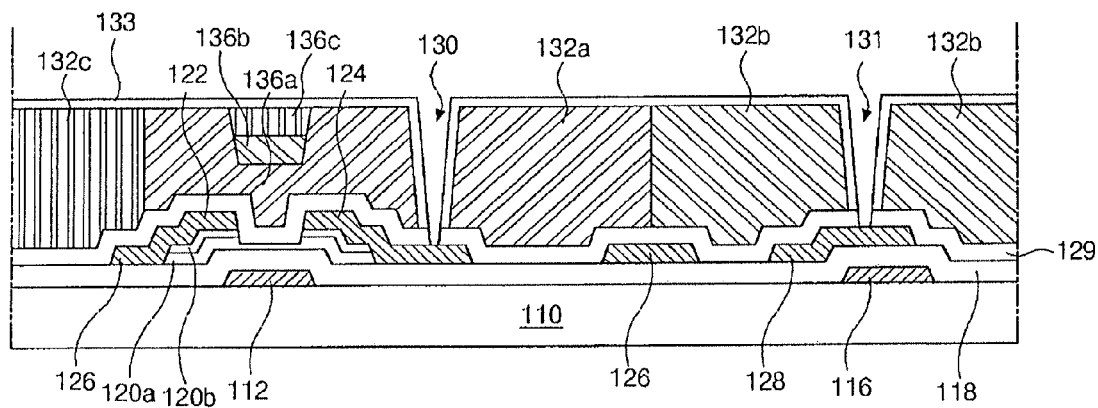
Figure 8C:
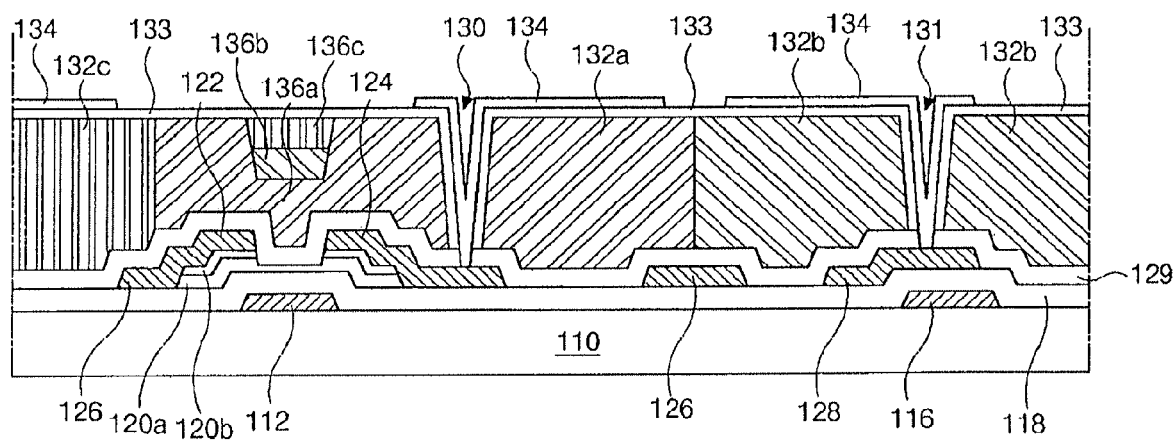

FIGS. 8A to 8C are cross-sectional views illustrating the process steps of fabricating the array substrate having a light-shielding color filter pattern according to another embodiment of the present invention. FIGS. 8A to 8C shows the fabrication processes after the process step of FIG. 7J because the previous process steps are the same as FIGS. 7A to 7J. Accordingly the detailed explanations until forming the color filter layer are omitted hereinafter.

In FIG. 8A, a third insulating layer 133 is formed over the entire surface of the substrate 110 to cover the color layer 132 and the light-shielding color filter pattern 136. The third insulating layer 133 may be an inorganic material, such as silicon nitride ($SiN_x$) or silicon oxide ($SiO_2$).

Thereafter as shown in FIG. 8B, exposed portions of the second insulating layer 129 are etched so that the drain and capacitor contact holes 130 and 131 extend to the underlying drain electrode 124 and second capacitor electrode 128, respectively. The drain contact hole 130 exposes a portion of the drain electrode 124, and the capacitor contact hole 131 exposes a portion of the second capacitor electrode 128.

FIG. 8C shows the step of forming a pixel electrode 134. A transparent electrode layer of indium tin oxide (ITO) or indium zinc oxide (IZO) is deposited over the entire surface of the substrate 100 to cover the patterned third insulating layer 133 and to contact the exposed portions of the drain electrode 124 and the second capacitor electrode 128. Thereafter, the transparent electrode layer is patterned through a mask process, so that the pixel electrode 134 is formed to correspond to each of the pixel regions $P_r$, $P_g$ and $P_b$. As shown in FIG. 8C, the pixel electrode 134 contacts the drain electrode 134 and the second capacitor electrode 128, respectively, through the expanded drain contact hole 130 and the expanded capacitor contact hole 131.

As mentioned before, since the array substrate in the embodiments of the present invention substitutes a light-shielding color filter pattern for a black matrix, it is possible to simplify the fabrication process and reduce the production cost. Furthermore, since the color filter layer is formed in the array substrate, it is not required to consider an aligning margin when designing and aligning the lower and upper substrates, thereby increasing the aperture ratio.

It will be apparent to those skilled in the art that various modifications and variations can be made in the method for fabricating the array substrate having color filter patterns on a thin film transistor structure for the liquid crystal display device of the present invention without departing from the spirit or scope of the inventions. Thus, it is intended that the present invention covers the modifications and variations of this invention provided they come within the scope of the appended claims and their equivalents.

The invention claimed is:

1. An array substrate for a liquid crystal display device, comprising:
   a plurality of gate lines formed on a first substrate along a transverse direction, each gate line including a gate electrode;
   a first insulating layer formed on the first substrate to cover the gate lines and the gate electrodes;
   a plurality of data lines formed on the first insulating layer along a longitudinal direction, the data lines defining a plurality of pixel regions with the gate lines and each including a source electrode;
   a thin film transistor formed at a crossing region of each of the gate and data lines, each thin film transistor including one of the gate electrodes, a semiconductor layer, one of the source electrodes, and a drain electrode;
   a color filter over the first insulating layer in each pixel region, each color filter having one of red, green or blue colors, the color filters having a plurality of drain contact holes exposing the drain electrodes;
   a light-shielding color filter pattern over each thin film transistor, each light-shielding color filter pattern including red, green and blue color filter patterns, wherein a first color filter pattern of red, green and blue color filter patterns has a trench accommodating a second color filter pattern of the red, green and blue color filter patterns; and
   a pixel electrode over the color filter in each pixel region, each pixel electrode contacting one of the drain electrodes.

2. The array substrate according to claim 1, wherein the trench corresponding to the semiconductor layer.

3. The array substrate according to claim 1, wherein the drain electrode is spaced apart from the source electrode such that a portion of the semiconductor layer is exposed through a space between the source electrode and the drain electrode.

4. The array substrate according to claim 3, wherein the trench corresponds to the portion of the semiconductor layer.

5. The array substrate according to claim 1, wherein a third color filter pattern of red, green and blue color filter patterns is stacked on the second color filter pattern.

6. The array substrate according to claim 1, further comprising a second insulating layer between the thin film transistors and the light-shielding color filter patterns and between the first insulating layer and the color filters, wherein the second insulating layer covers the source electrodes, the drain electrodes and the data lines and wherein the drain contact holes extend through the second insulating layer.

7. The array substrate according to claim 1, further comprising a third insulating layer between the color filters and the pixel electrodes, wherein the third insulating layer covers the color filters and the light-shielding color filter patterns.

8. The array substrate according to claim 1, wherein a portion of each gate line acts as a first capacitor electrode, wherein the liquid crystal display device further comprises a second capacitor electrode on the first insulating layer over each portion of the gate line, wherein the second capacitor electrode and the portion of the gate line constitute a storage capacitor with the first insulating layer interposed between the portion of the gate line and the second capacitor electrode, wherein each color filter includes a capacitor contact hole exposing the second capacitor electrode, and wherein the pixel electrodes contact the second capacitor electrodes through the capacitor contact holes.

9. A method of fabricating an array substrate for a liquid crystal display device, comprising:
   forming a plurality of gate lines on a first substrate along a transverse direction, each gate line including a gate electrode;
   forming a first insulating layer on the first substrate to cover the gate lines and the gate electrodes;
   forming a plurality of data lines on the first insulating layer along a longitudinal direction, the data lines defining a plurality of pixel regions with the gate lines and each including a source electrode;
   forming a thin film transistor formed at a crossing region of each of the gate and data lines, each thin film transistor including one of the gate electrodes, a semiconductor layer, one of the source electrodes, and a drain electrode;
   forming a color filter over the first insulating layer in each pixel region and a light-shielding color filter pattern over each thin film transistor, each color filter having one of red, green or blue colors, each light-shielding color filter pattern including red, green and blue color filter patterns, wherein a first color filter pattern of red, green and blue color filter patterns has a trench accommodating a second color filter pattern of the red, green and blue color filter patterns; and
   forming a pixel electrode over the color filter in each pixel region, each pixel electrode contacting one of the drain electrodes.

10. The method according to claim 9, wherein the trench corresponding to the semiconductor layer.

11. The method according to claim 9, wherein the drain electrode is spaced apart from the source electrode such that a portion of the semiconductor layer is exposed through a space between the source electrode and the drain electrode.

12. The method according to claim 11, wherein the trench corresponds to the portion of the semiconductor layer.

13. The method according to claim 9, wherein a third color filter pattern of red, green and blue color filter patterns is stacked on the second color filter pattern.

14. The method according to claim 9, further comprising forming a second insulating layer between the thin film transistors and the light-shielding color filter patterns and between the first insulating layer and the color filters, wherein the second insulating layer covers the source electrodes, the drain electrodes and the data lines and wherein the drain contact holes extend through the second insulating layer.

15. The method according to claim 9, further comprising forming a third insulating layer between the color filters and the pixel electrodes, wherein the third insulating layer covers the color filters and the light-shielding color filter patterns.

16. The method according to claim 9, wherein the step of forming the plurality of data lines includes forming a first capacitor electrode on the first insulating layer over a portion of each gate line, the portion of the gate line acts as a second capacitor electrode, wherein the first capacitor electrode and the portion of the gate line constitute a storage capacitor with the first insulating layer interposed between the portion of the gate line and the first capacitor electrode, wherein each color filter includes a capacitor contact hole exposing the first capacitor electrode, and wherein the pixel electrodes contact the first capacitor electrodes through the capacitor contact holes.

\* \* \* \* \*